US012414329B2

(12) United States Patent
Chen et al.

(10) Patent No.: US 12,414,329 B2
(45) Date of Patent: Sep. 9, 2025

(54) FORMING LOW-RESISTANCE CAPPING LAYER OVER METAL GATE ELECTRODE

(71) Applicant: Taiwan Semiconductor Manufacturing Company, Ltd., Hsin-Chu (TW)

(72) Inventors: Chia-Wei Chen, Hsinchu (TW); Wei Cheng Hsu, Hsinchu (TW); Hui-Chi Chen, Hsinchu County (TW); Jian-Hao Chen, Hsinchu (TW); Kuo-Feng Yu, Hsinchu County (TW); Shih-Hang Chiu, Taichung (TW); Wei-Cheng Wang, Hsinchu (TW); Yen-Ju Chen, Hsinchu (TW); Chun-Chih Cheng, Changhua County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 749 days.

(21) Appl. No.: 17/737,851

(22) Filed: May 5, 2022

(65) Prior Publication Data
US 2023/0010952 A1 Jan. 12, 2023

Related U.S. Application Data

(60) Provisional application No. 63/220,164, filed on Jul. 9, 2021.

(51) Int. Cl.
*H01L 23/00* (2006.01)
*H10D 30/01* (2025.01)
(Continued)

(52) U.S. Cl.
CPC ....... *H10D 30/6735* (2025.01); *H10D 30/031* (2025.01); *H10D 30/6729* (2025.01);
(Continued)

(58) Field of Classification Search
CPC ............. H10D 30/6735; H10D 30/031; H10D 30/6729; H10D 30/6739; H10D 30/6757; H10D 62/118; H10D 64/01; H10D 62/121
See application file for complete search history.

(56) References Cited

U.S. PATENT DOCUMENTS

| 8,487,378 B2 | 7/2013 | Goto et al. |
| 8,729,634 B2 | 5/2014 | Shen et al. |

(Continued)

FOREIGN PATENT DOCUMENTS

TW 201937609 A 9/2019

*Primary Examiner* — Samuel Park
(74) *Attorney, Agent, or Firm* — HAYNES AND BOONE, LLP

(57) ABSTRACT

A semiconductor device includes stacks of nano-structures that each extend in a first horizontal direction. The stacks each extend in a vertical direction and are separated from one another in a second horizontal direction. A first gate is disposed over a first subset of the stacks. A second gate is disposed over a second subset of the stacks. A first conductive capping layer is disposed over a substantial entirety of an upper surface of the first gate. A second conductive capping layer is disposed over a substantial entirety of an upper surface of the second gate. A dielectric structure is disposed between the first gate and the second gate in the second horizontal direction. The dielectric structure physically and electrically separates the first gate and the second gate. An upper surface of the dielectric structure is substantially free of having the first or second conductive capping layers disposed thereon.

23 Claims, 24 Drawing Sheets

(51) Int. Cl.
*H10D 30/67* (2025.01)
*H10D 62/10* (2025.01)
*H10D 64/01* (2025.01)

(52) U.S. Cl.
CPC ..... *H10D 30/6739* (2025.01); *H10D 30/6757* (2025.01); *H10D 62/118* (2025.01); *H10D 64/01* (2025.01)

(56) References Cited

U.S. PATENT DOCUMENTS

| | | | |
|---|---|---|---|
| 8,826,213 | B1 | 9/2014 | Ho et al. |
| 8,887,106 | B2 | 11/2014 | Ho et al. |
| 9,991,352 | B1 * | 6/2018 | Frougier ............ H10D 30/6757 |
| 2013/0334606 | A1 | 12/2013 | Shen |
| 2014/0282326 | A1 | 9/2014 | Hsin et al. |
| 2015/0041909 | A1 | 2/2015 | Bouche |
| 2016/0204221 | A1 | 7/2016 | He |
| 2019/0259619 | A1 | 8/2019 | Zang |
| 2020/0135476 | A1 | 4/2020 | Huang |
| 2020/0152736 | A1 | 5/2020 | Yu |
| 2022/0208790 | A1 * | 6/2022 | Yoon .................... H10D 62/116 |
| 2022/0293730 | A1 * | 9/2022 | Kim ..................... H10D 64/015 |

* cited by examiner

FORMING LOW-RESISTANCE CAPPING LAYER OVER METAL GATE ELECTRODE

PRIORITY DATA

The present application is a utility application of provisional U.S. patent application Ser. No. 63/220,164, filed on Jul. 9, 2021, entitled "Forming Low-Resistance Capping Layer Over Metal Gate Electrode", the disclosure of which is hereby incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as the sizes of the transistor components continue to get smaller, gate resistance may increase undesirably, particularly for devices located far away from the gate vias. The increase in gate resistance may adversely impact device performance such as a speed.

Therefore, although existing semiconductor devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

DETAILED DESCRIPTION

Figure 1B:
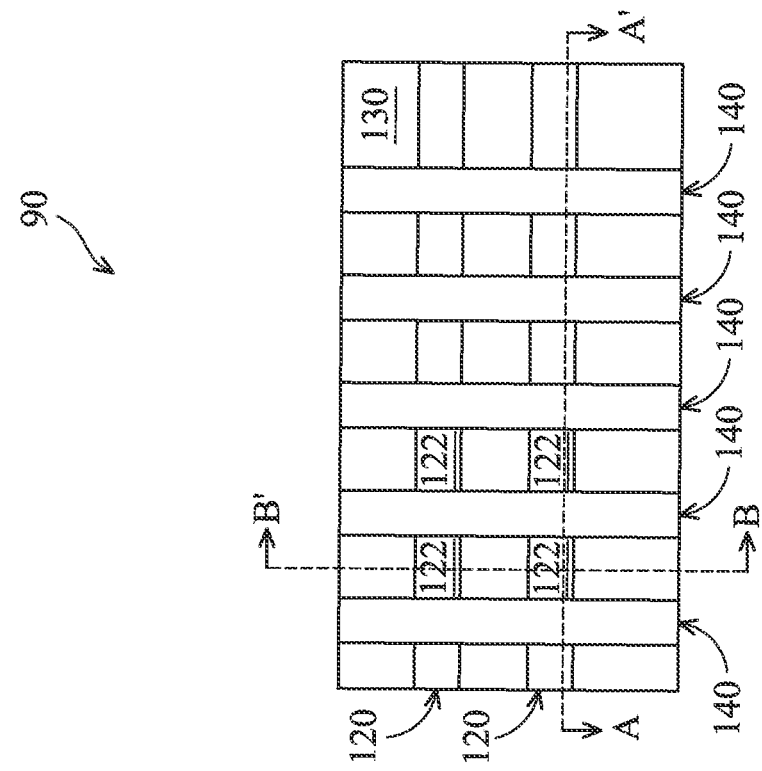
FIG. 1B illustrates a top view of a FinFET device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices, which may be fabricated using field-effect transistors (FETs) such as three-dimensional fin-line FETs (FinFETs) or multi-channel gate-all-around (GAA) devices. FinFET devices have semiconductor fin structures that protrude vertically out of a substrate. The fin structures are active regions, from which source/drain regions and/or channel regions are formed. The gate structures partially wrap around the fin structures. GAA devices have multiple elongated nano-structure channels that may be implemented as nano-tubes, nano-sheets, or nanowires. In recent years, FinFET devices and GAA devices have gained popularity due to their enhanced performance compared to conventional planar transistors. However, as semiconductor device sizes continue to get scaled down, the imperfections within FinFET or GAA devices may lead to potential problems.

In more detail, modern FinFET and/or GAA device fabrication may involve forming a high-k metal gate (HKMG) structure, which contains a high-k gate dielectric (with a dielectric constant greater than that of silicon oxide) and a metal gate electrode. As device sizes continue to get scaled down, however, gate resistance may become a greater concern, since an increase in gate resistance may result in a slower device speed. For example, recent semiconductor technology nodes may involve forming a HKMG structure that wraps around a plurality of vertically protruding active regions structures (e.g., vertical stacks of nano-structures in the case of a GAA device, or fin structures in the case of a FinFET device), and then forming a gate via over the HKMG structure to provide electrical connectivity to the HKMG structure and the active regions structures below. As the semiconductor device scaling down continues, the HKMG structure may be wrapping over an even greater number of active region structures. Compared to the active region structures located close to the gate via, the active region structures that are located farther away from the gate via (e.g., active region structures at or near the end of a row of active region structures) may experience a substantially longer signal path for electrical signals traveling to and from the gate via. The longer signal path may lead to an increase in resistance, which is referred to as gate resistance herein. As gate resistance increases, a time constant (which is a product of resistance and capacitance) also increases, which results in a slower speed for the semiconductor device, particularly for the devices corresponding to the active region structures at or near the end of the row of the active region structures.

To address the problem discussed above, the present disclosure introduces a low-resistance layer (e.g., a tungsten-containing layer) over the gate electrode of the GAA and/or GAA FinFET devices. In some embodiments, the low-resistance layer may be implemented as a capping layer at the top of the metal gate electrode. The low-resistance capping layer has a substantially lower resistivity compared to the gate via and the various metal layers of the gate electrode. As such, gate resistance may be substantially reduced even for devices at or near the end of the row of active region structures. The reduction in gate resistance results in a slower delay and/or faster device speed.

Figure 1A:
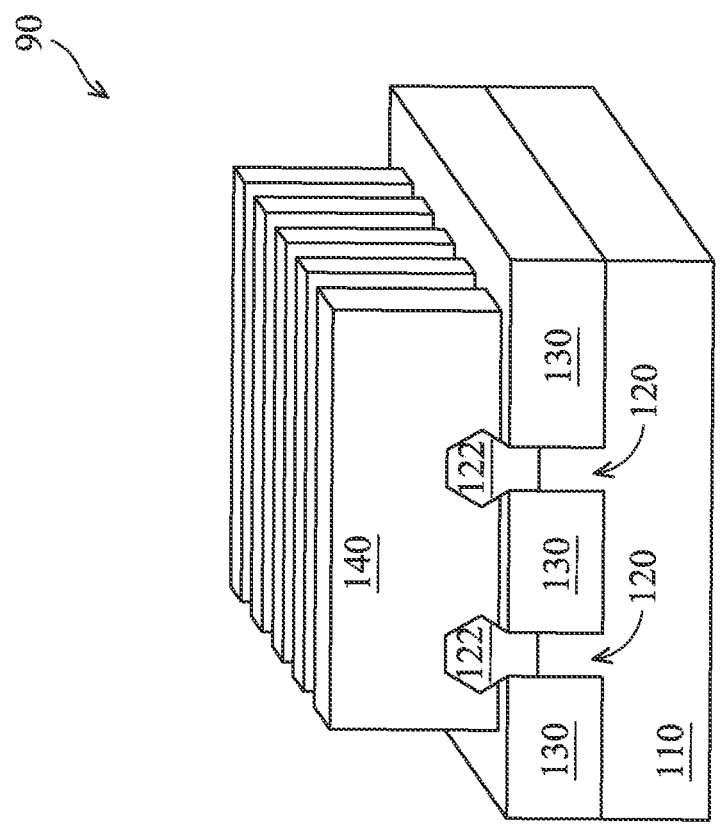
FIG. 1A illustrates a three-dimensional perspective view of a FinFET device.
Figure 1C:
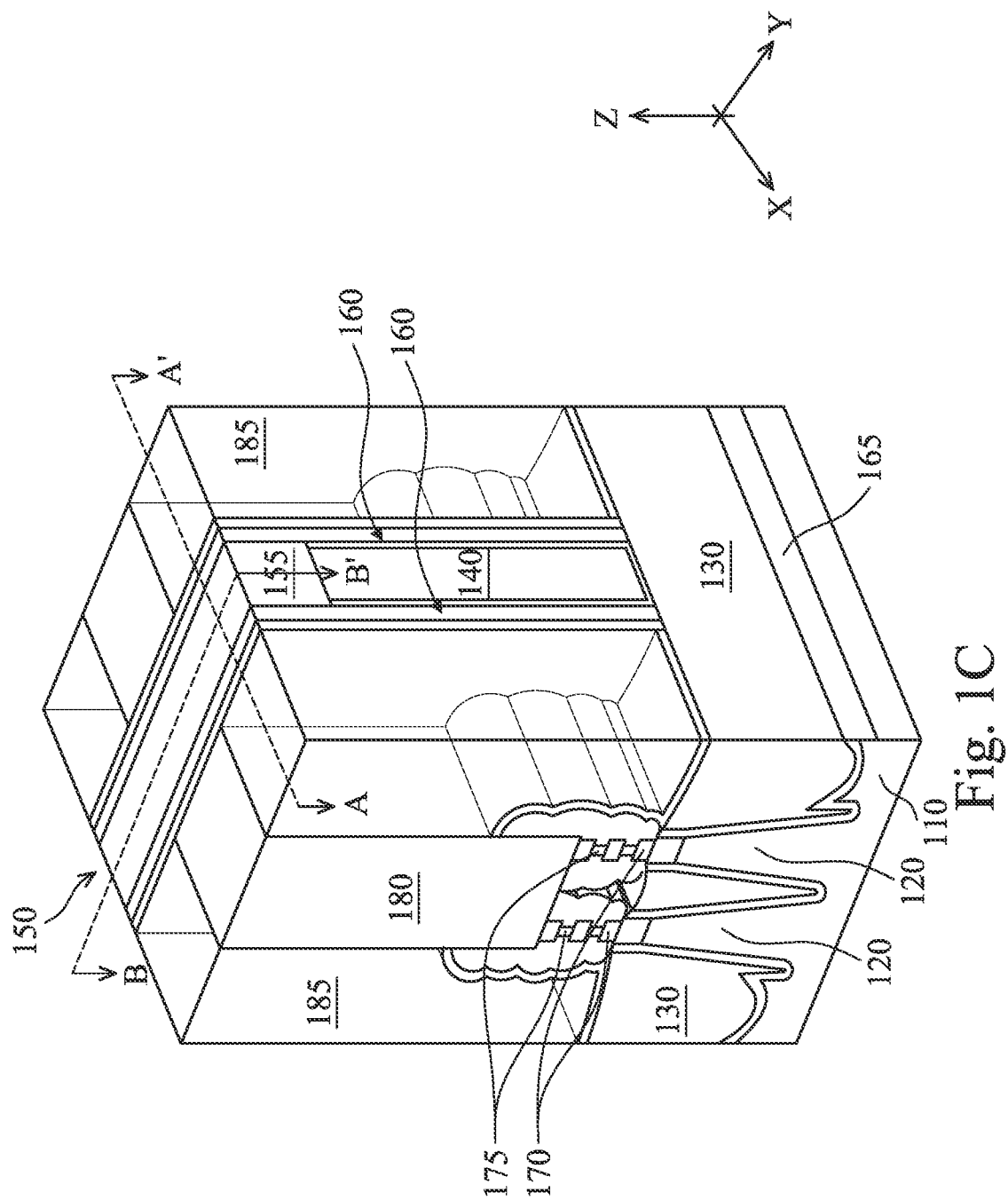
FIG. 1C illustrates a three-dimensional perspective view of a multi-channel gate-all-around (GAA) device.
Figure 19:
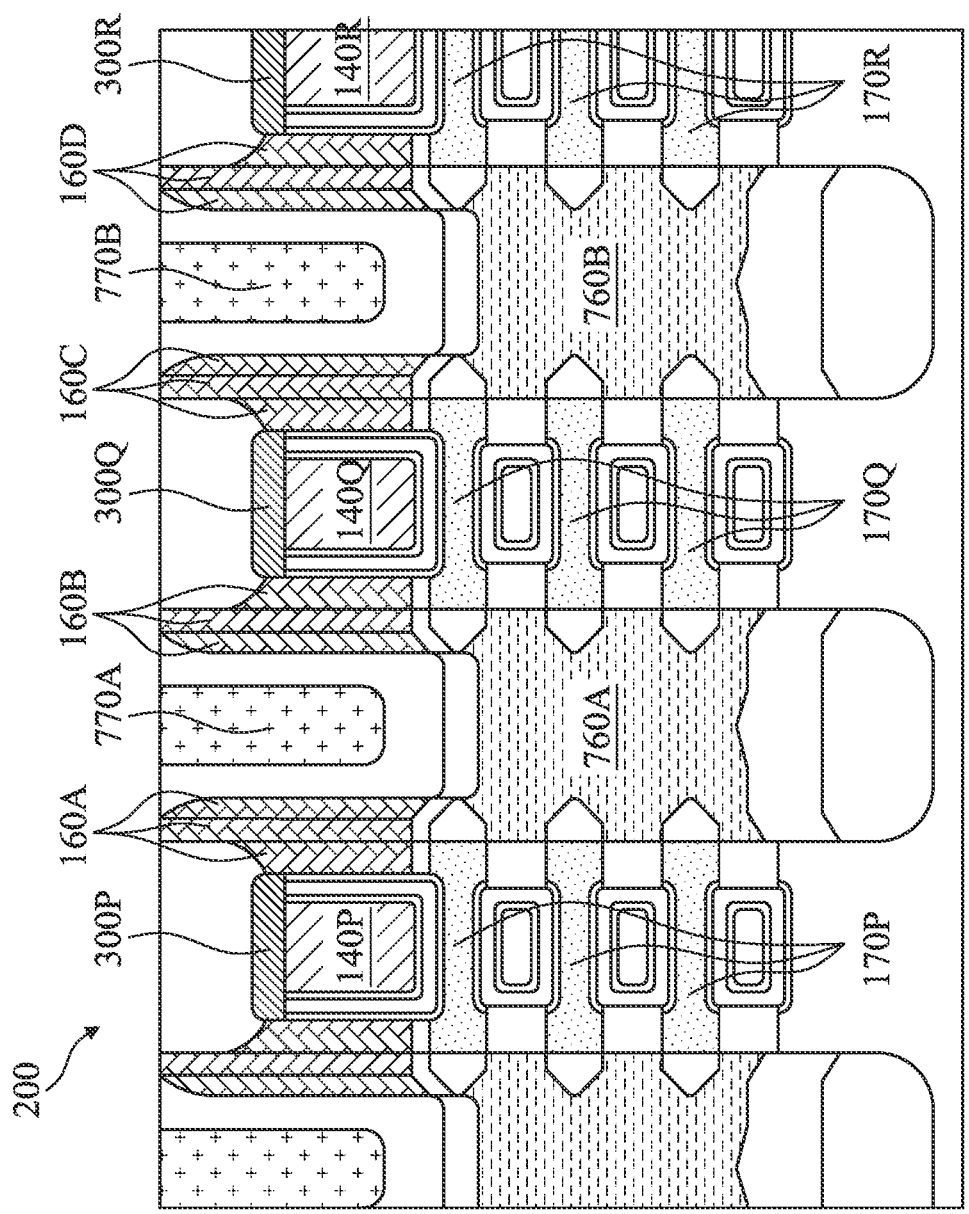
FIG. 19 illustrates a cross-sectional view of a semiconductor device at a stage of fabrication according to embodiments of the present disclosure.
Figure 20:
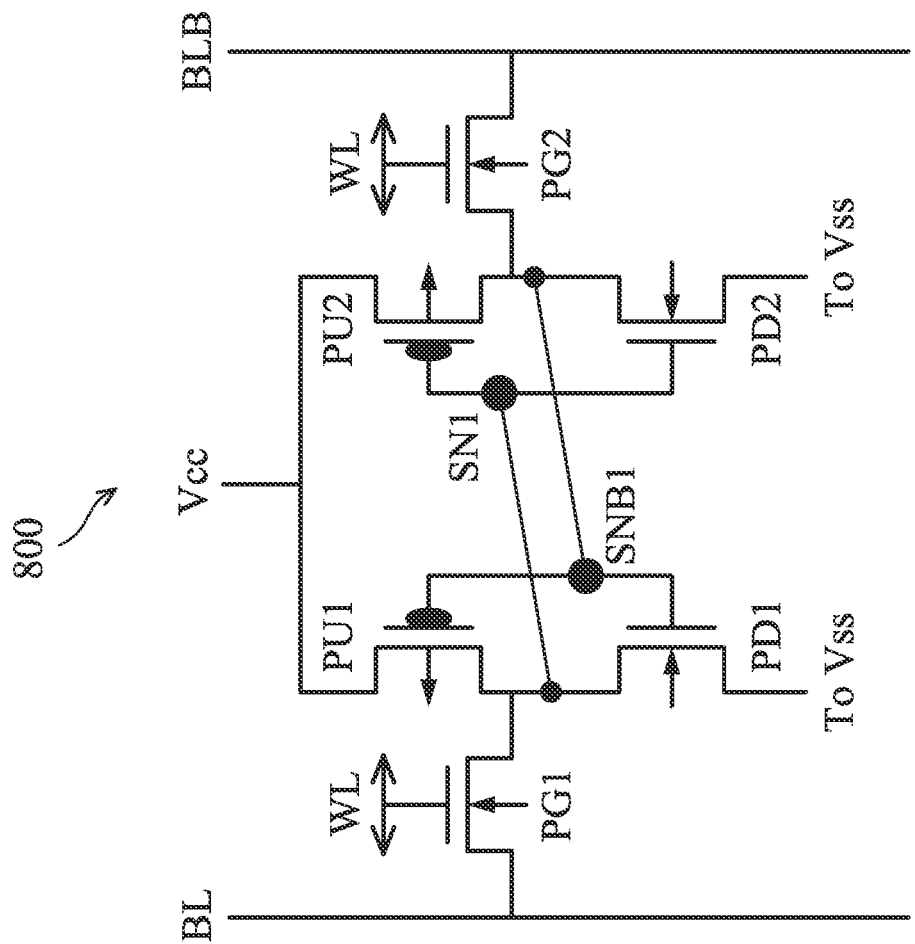
FIG. 20 illustrates a Static Random Access Memory (SRAM) cell according to an embodiment of the present disclosure.
Figure 21:
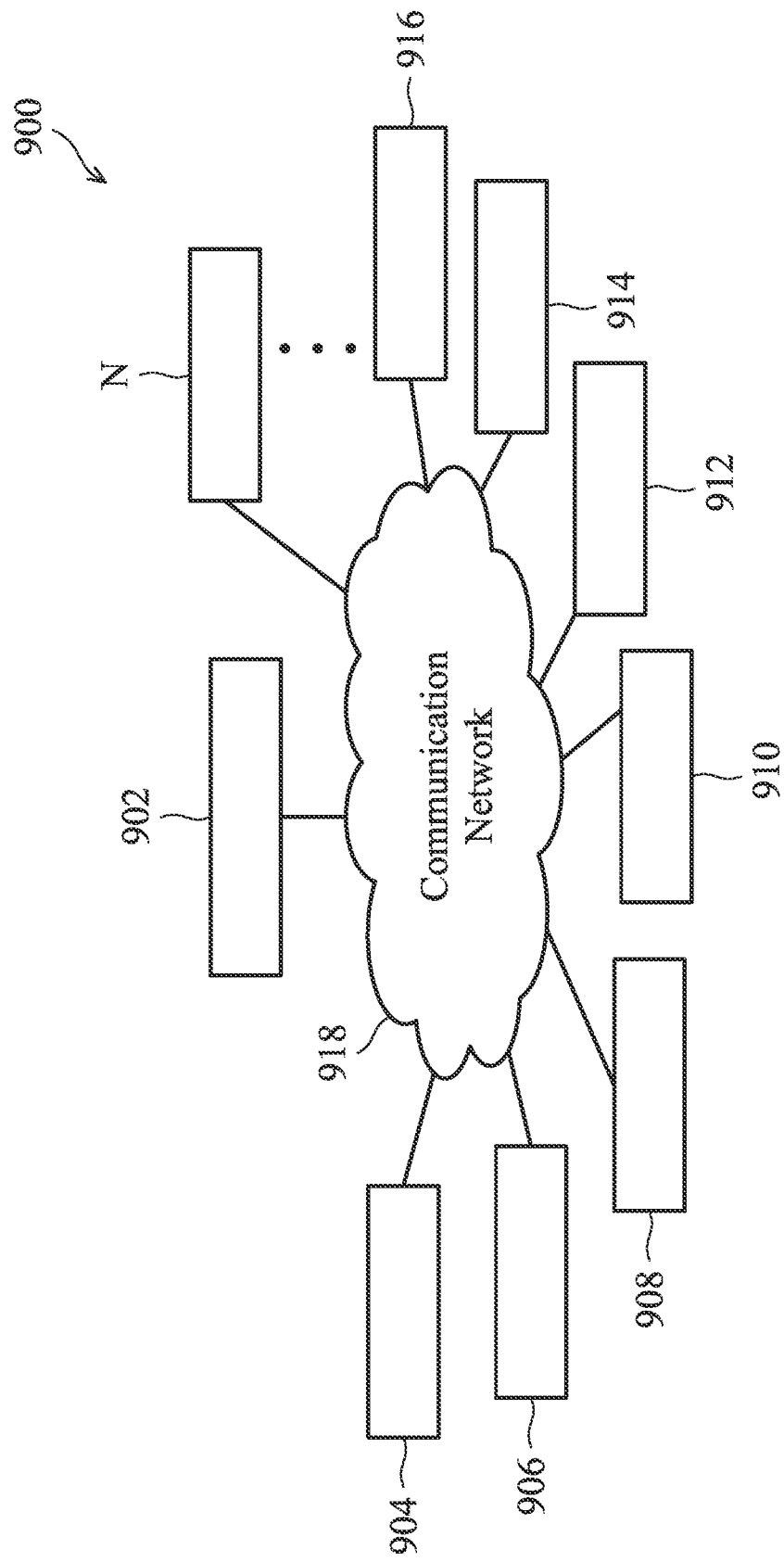
FIG. 21 illustrates an integrated circuit fabrication system according to an embodiment of the present disclosure.
Figure 22:
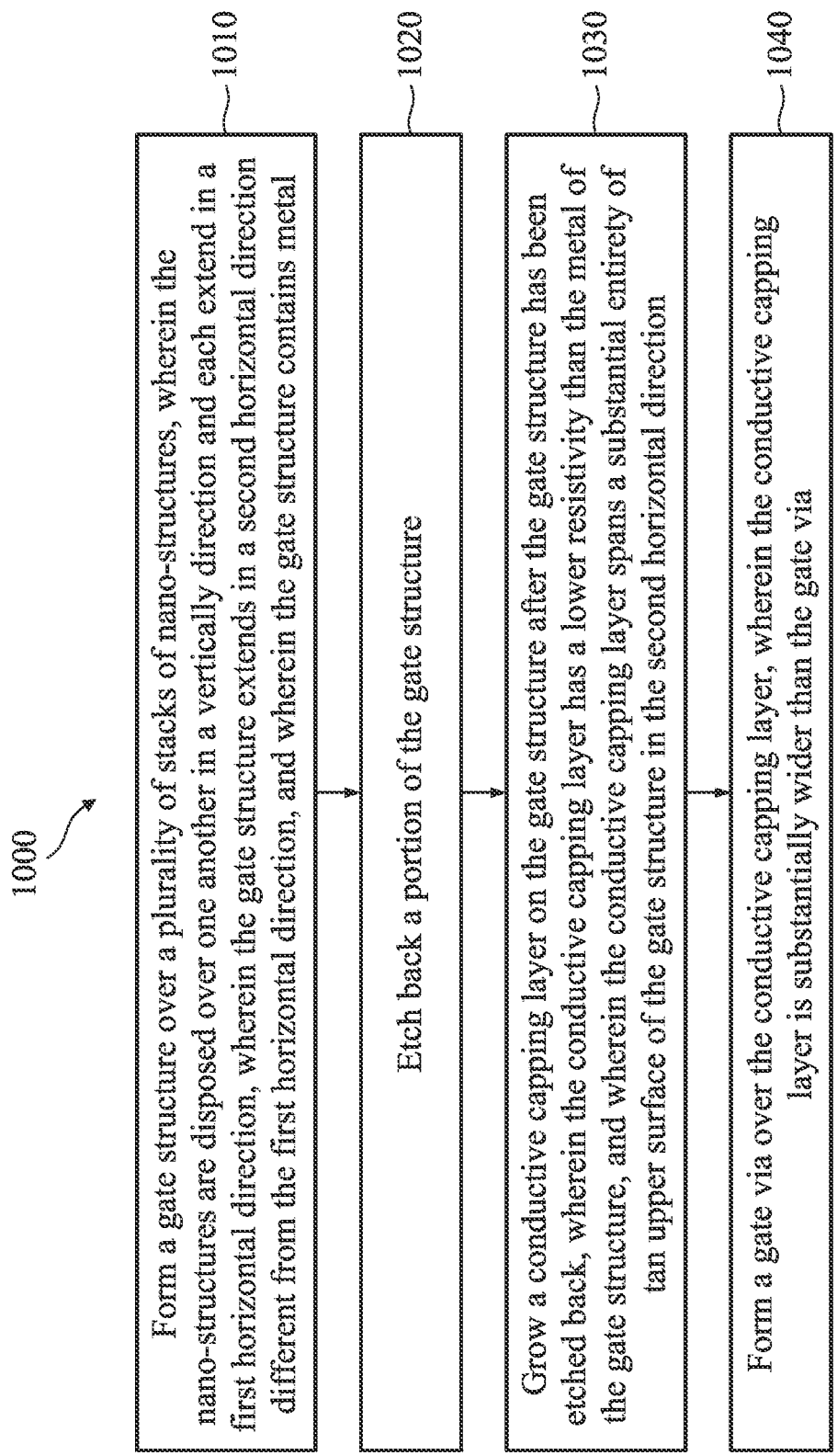
FIGS. 22-23 is a flowchart illustrating a method of fabricating a semiconductor device according to various aspects of the present disclosure.
Figure 23:
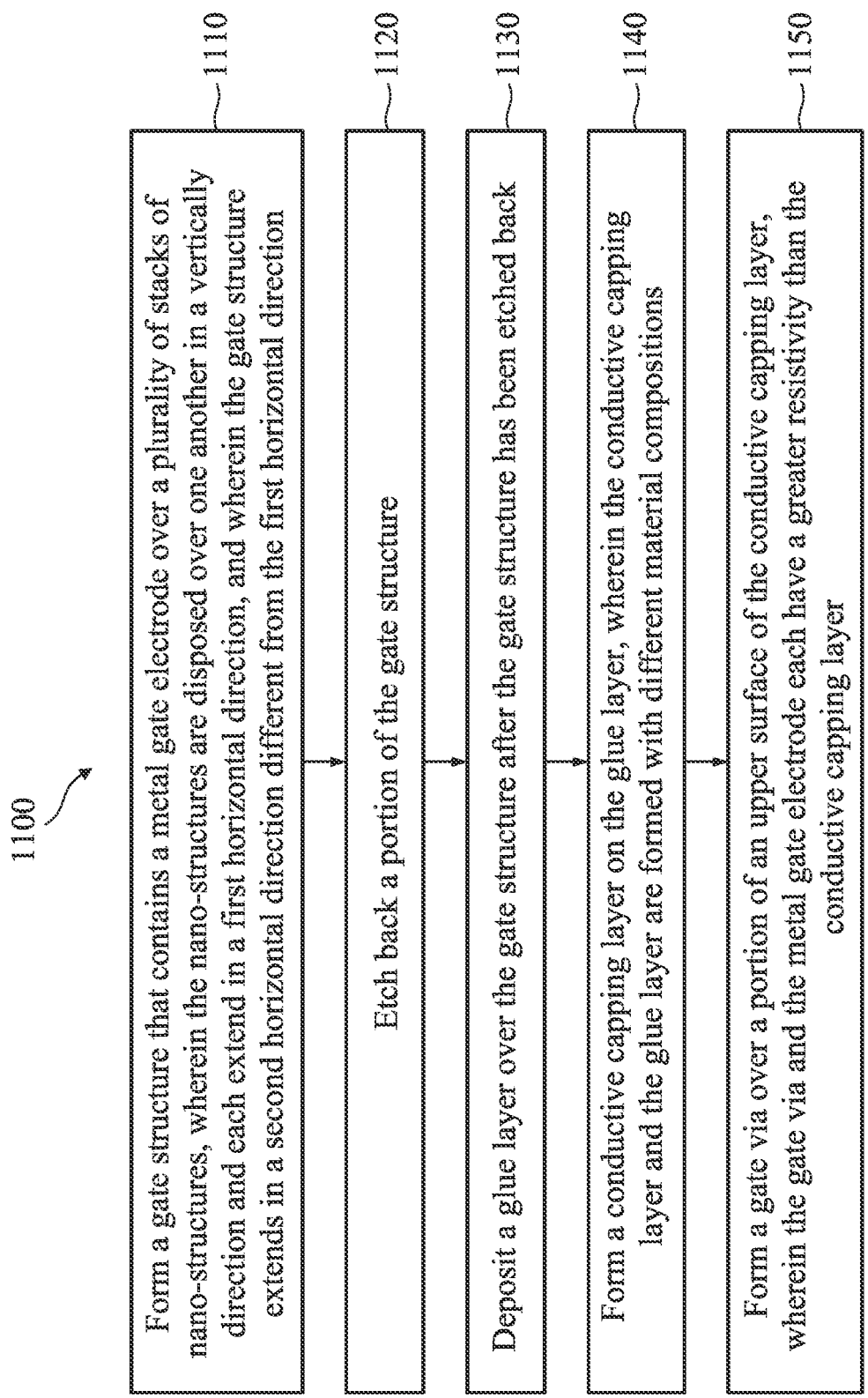

The various aspects of the present disclosure are now discussed below with reference to FIGS. 1A-1C and 2-19. In more detail, FIGS. 1A-B illustrate an example FinFET device, and FIG. 1C illustrates an example GAA device. FIGS. 2-19 illustrate cross-sectional side, top, or three-dimensional perspective views, of an IC device at various stages of fabrication according to embodiments of the present disclosure. FIG. 20 illustrates a memory circuit as an example IC application implemented using IC devices fabricated according to the various aspects of the present disclosure. FIG. 21 illustrates a semiconductor fabrication system. FIGS. 22-23 each illustrate a flowchart of a method of fabricating an IC device according to various aspects of the present disclosure.

Referring now to FIGS. 1A and 1B, a three-dimensional perspective view and a top view of a portion of an Integrated Circuit (IC) device 90 are illustrated, respectively. The IC device 90 is implemented using FinFETs. As shown in FIG. 1A, the IC device 90 includes a substrate 110. The substrate 110 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor such as SiGe, GaAsP, AlInAs, AlGaAs, GaInAs, GaInP, GaInAsP, and/or other suitable materials. The substrate 110 may be a single-layer material having a uniform composition. Alternatively, the substrate 110 may include multiple material layers having similar or different compositions suitable for IC device manufacturing. In one example, the substrate 110 may be a silicon-on-insulator (SOI) substrate having a semiconductor silicon layer formed on a silicon oxide layer. In another example, the substrate 110 may include a conductive layer, a semiconductor layer, a dielectric layer, other layers, or combinations thereof. Various doped regions, such as source/drain regions, may be formed in or on the substrate 110. The doped regions may be doped with n-type dopants, such as phosphorus or arsenic, and/or p-type dopants, such as boron, depending on design requirements. The doped regions may be formed directly on the substrate 110, in a p-well structure, in an n-well structure, in a dual-well structure, or using a raised structure. Doped regions may be formed by implantation of dopant atoms, in-situ doped epitaxial growth, and/or other suitable techniques.

Three-dimensional active regions 120 are formed on the substrate 110. The active regions 120 may include elongated fin-like structures that protrude upwardly out of the substrate 110. As such, the active regions 120 may be interchangeably referred to as fin structures 120 or fins 120 hereinafter. The fin structures 120 may be fabricated using suitable processes including photolithography and etch processes. The photolithography process may include forming a photoresist layer overlying the substrate 110, exposing the photoresist to a pattern, performing post-exposure bake processes, and developing the photoresist to form a masking element (not shown) including the resist. The masking element is then used for etching recesses into the substrate 110, leaving the fin structures 120 on the substrate 110. The etching process may include dry etching, wet etching, reactive ion etching (RIE), and/or other suitable processes. In some embodiments, the fin structure 120 may be formed by double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. As an example, a layer may be formed over a substrate and patterned using a photolithography process. Spacers are formed alongside the patterned layer using a self-aligned process. The layer is then removed, and the remaining spacers, or mandrels, may then be used to pattern the fin structures 120.

The IC device 90 also includes source/drain features 122 formed over the fin structures 120. The source/drain features 122 may include epi-layers that are epitaxially grown on the fin structures 120. The IC device 90 further includes isolation structures 130 formed over the substrate 110. The isolation structures 130 electrically separate various components of the IC device 90. The isolation structures 130 may include silicon oxide, silicon nitride, silicon oxynitride, fluoride-doped silicate glass (FSG), a low-k dielectric material, and/or other suitable materials. In some embodiments, the isolation structures 130 may include shallow trench isolation (STI) features. In one embodiment, the isolation structures 130 are formed by etching trenches in the substrate 110 during the formation of the fin structures 120. The trenches may then be filled with an isolating material described above, followed by a chemical mechanical planarization (CMP) process. Other isolation structure such as field oxide, local oxidation of silicon (LOCOS), and/or other suitable structures may also be implemented as the isolation structures 130. Alternatively, the isolation structures 130 may include a multi-layer structure, for example, having one or more thermal oxide liner layers.

The IC device 90 also includes gate structures 140 formed over and engaging the fin structures 120 on three sides in a channel region of each fin 120. In other words, the gate structures 140 each wrap around a plurality of fin structures 120. The gate structures 140 may be dummy gate structures (e.g., containing an oxide gate dielectric and a polysilicon gate electrode), or they may be HKMG structures that contain a high-k gate dielectric and a metal gate electrode, where the HKMG structures are formed by replacing the dummy gate structures. Though not depicted herein, the gate structure 140 may include additional material layers, such as an interfacial layer over the fin structures 120, a capping layer, other suitable layers, or combinations thereof.

Referring to FIGS. 1A-1B, multiple fin structures 120 are each oriented lengthwise along the X-direction, and multiple gate structure 140 are each oriented lengthwise along the Y-direction, i.e., generally perpendicular to the fin structures 120. In many embodiments, the IC device 90 includes additional features such as gate spacers disposed along sidewalls of the gate structures 140, hard mask layer(s) disposed over the gate structures 140, and numerous other features.

FIG. 1C illustrates a three-dimensional perspective view of an example GAA device 150. For reasons of consistency and clarity, similar components in FIG. 1C and FIGS. 1A-1B will be labeled the same. For example, active regions such as fin structures 120 rise vertically upwards out of the substrate 110 in the Z-direction. The isolation structures 130 provide electrical separation between the fin structures 120. The gate structure 140 is located over the fin structures 120 and over the isolation structures 130. A mask 155 is located over the gate structure 140, and gate spacers 160 are located on sidewalls of the gate structure 140. A capping layer 165 is formed over the fin structures 120 to protect the fin structures 120 from oxidation during the forming of the isolation structures 130.

A plurality of nano-structures 170 are disposed over each of the fin structures 120. The nano-structures 170 may include nano-sheets, nano-tubes, or nano-wires, or some other type of nano-structure that extends horizontally in the X-direction. Portions of the nano-structures 170 under the gate structure 140 may serve as the channels of the GAA device 150. Dielectric inner spacers 175 may be disposed between the nano-structures 170. In addition, although not illustrated for reasons of simplicity, each stack of the nano-structures 170 may be wrapped around circumferentially by a gate dielectric as well as a gate electrode. In the illustrated embodiment, the portions of the nano-structures 170 outside the gate structure 140 may serve as the source/drain features of the GAA device 150. However, in some embodiments, continuous source/drain features may be epitaxially grown over portions of the fin structures 120 outside of the gate structure 140. Regardless, conductive source/drain contacts 180 may be formed over the source/drain features to provide electrical connectivity thereto. An interlayer dielectric (ILD) 185 is formed over the isolation structures 130 and around the gate structure 140 and the source/drain contacts 180.

Additional details pertaining to the fabrication of GAA devices are disclosed in U.S. Pat. No. 10,164,012, titled "Semiconductor Device and Manufacturing Method Thereof" and issued on Dec. 25, 2018, as well as in U.S. Pat. No. 10,361,278, titled "Method of Manufacturing a Semiconductor Device and a Semiconductor Device" and issued on Jul. 23, 2019, and also in U.S. Pat. No. 9,887,269, titled "Multi-Gate Device and Method of Fabrication Thereof" and issued on Feb. 6, 2018, the disclosures of each which are hereby incorporated by reference in their respective entireties. To the extent that the present disclosure refers to a fin structure or FinFET devices, such discussions may apply equally to the GAA devices.

Figure 2:
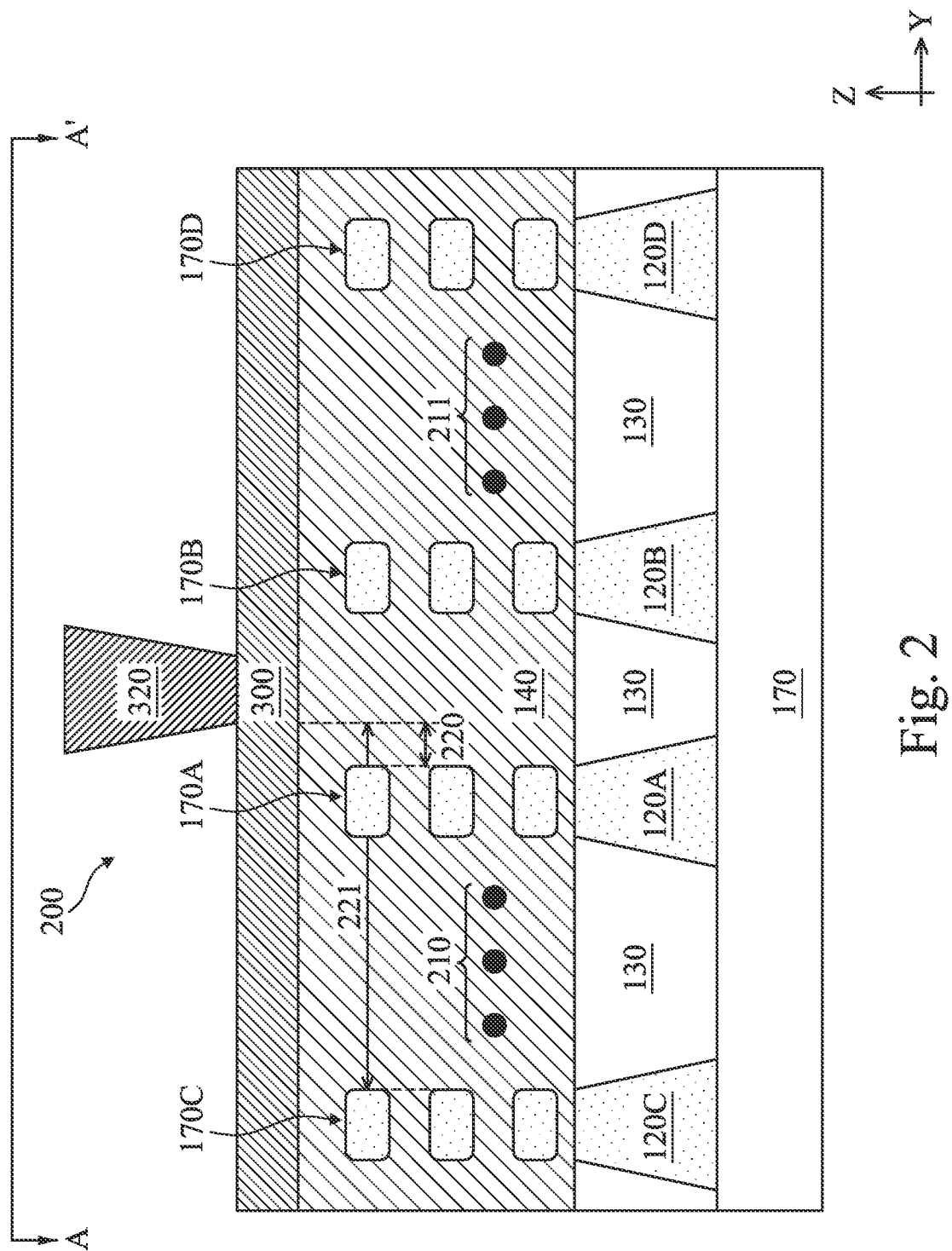
FIGS. 2-15 illustrate a series of cross-sectional views of a semiconductor device at various stages of fabrication according to embodiments of the present disclosure.

FIG. 2 is a diagrammatic fragmentary cross-sectional side view of a portion of an IC device 200 at a given stage of fabrication according to embodiments of the present disclosure. The IC device 200 may be implemented as a FinFET or a GAA device, though it is illustrated as a GAA device herein for reasons of simplicity.

The cross-sectional side view of FIG. 2 is taken across a plane defined by the Y-direction and Z-direction (e.g., across a Y-Z plane). As such, the cross-sectional side view of FIG. 2 may also be referred to as a Y-cut. In some embodiments, the cross-sectional side view of the IC device 200 in FIG. 2 may be obtained by taking a cross-sectional cut along the cutline A-A'. It is also understood that although the discussions below primarily use a GAA device (e.g., the GAA device of FIG. 1C) to illustrate the inventive concepts of the present disclosure, the same concepts may apply to the FinFET device (e.g., the FinFET device of FIGS. 1A-1B) as well, unless otherwise noted.

As shown in FIG. 2, the IC device 200 includes the substrate 110 discussed above with reference to FIGS. 1A-1C, for example a silicon substrate. A plurality of active regions may be formed by patterning the substrate 110. For example, the active regions may include the stacks of nano-structures 170 discussed above with reference to FIG. 1C. The stacks of nano-structures shown in FIG. 2 are labeled with separate reference numerals 170A, 170B, 170C, and 170D for ease of reference in the discussions below. Nevertheless, it is understood that the nano-structures 170A-170D each protrude vertically upwards (in the Z-direction) out of the substrate 110 and each extend laterally in the X-direction, just like the nano-structures 170 of FIG. 1C. It is understood that although four example nano-structures 170A-170D are illustrated herein, the IC device 200 may include a substantially greater number of nano-structures, for example over twenty or thirty of fin structures similar to the nano-structures 170A-170D. The fin structures disposed between the nano-structures 170A-170C are not specifically illustrated herein but instead are represented by a plurality of dots 210, and the fin structures disposed between the fin structures nano-structures 170B-170D are not specifically illustrated herein but instead are represented by a plurality of dots 211.

The bottom portions of the nano-structures 170 may include fin structures 120, which are separated from one another in the Y-direction by the isolation structures 130, which may include a suitable dielectric material such as silicon oxide, silicon nitride, silicon oxynitride, fluoride-doped silicate glass (FSG), as discussed above with reference to FIGS. 1A-1B. In the illustrated embodiment, the isolation structures 130 include shallow trench isolation (STI) structures.

Still referring to FIG. 2, the IC device 200 includes a high-k metal gate (HKMG) structure 140. The HKMG structure 140 may include a high-k gate dielectric and a metal-containing gate electrode. The high-k gate dielectric contains a high-k dielectric material, which refers to a dielectric material having a dielectric constant that is greater than a dielectric constant of silicon oxide (e.g., about 3.9). Example materials of the high-gate k dielectric include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, or combinations thereof. The metal-containing gate electrode is formed over the high-k gate dielectric. The metal-containing gate electrode may include one or more work function (WF) metal layers and a fill metal layer. The work function metal layers may be configured to tune a work function of the respective transistor. Example materials for the work function metal layers may include titanium nitride (TiN), Titanium aluminide (TiAl), tantalum nitride (TaN), titanium carbide (Tic), tantalum carbide (TaC), tungsten carbide (WC), aluminum titanium nitride (TiAlN), zirconium aluminide (ZrAl), tungsten aluminide (WAl), tantalum aluminide (TaAl), hafnium aluminide (HfAl), or combinations thereof. The fill metal layer may serve as the main conductive portion of the metal-containing gate electrode. In some embodiments, the fill metal layer may include cobalt, tungsten, copper, aluminum, or alloys or combinations thereof. It is understood that the HKMG structure may include additional layers, such as interfacial layers, capping layers, diffusion/barrier layers, or other applicable layers.

According an aspect of the present disclosure, the IC device 200 includes a conductive capping layer 300 that is formed over an upper surface of the HKMG structure 140. A gate via 320 is then formed over the conductive capping layer 300. The conductive capping layer 300 may be formed over a substantial majority (e.g., greater than 90%) of an upper surface of the HKMG structure 140, at least in the Y-direction. In other words, in the cross-sectional Y-cut side view, a substantial entirety (e.g., at least 90%) of the upper surface of the HKMG structure 140 has the conductive capping layer 300 formed thereon. In some embodiments, the conductive capping layer 300 is formed over an entirety of an upper surface of the HKMG structure 140 in at least the Y-direction. Accordingly, a dimension of the conductive capping layer 300 in the Y-direction is substantially greater (e.g., at least several times greater) than a maximum dimension of the gate via 320 in the Y-direction. Note that the HKMG structure 140 may be physically and electrically separated from other adjacent HKMG structures (not illustrated herein) based on requirements of the circuit design, and in such cases, the conductive capping layer 300 is also broken up to ensure that these HKMG structures are not inadvertently shorted electrically, which will be discussed in greater detail below.

Still referring to FIG. 2, the conductive capping layer 300 has a lower resistivity than the metal-containing electrode of the HKMG, as well as a lower resistivity than the gate via 320. In that regard, resistivity of a specific type of material measures the electrical resistance of that specific type of material to electrical conduction on a per unit (e.g., length, or volume) basis. As such, a material with a lower resistivity is a better electrical conductor than a material with a higher resistivity, assuming that the two materials have the same size and operate within the same environment.

One of the reasons for the implementation of the conductive capping layer 300 is to reduce the gate resistance. In more detail, the gate via 320 is formed to provide electrical connectivity to the HKMG structure 140 and the nano-structures 170A-170D disposed underneath the HKMG structure 140. However, after propagating vertically through the gate via 320, electrical signals have to travel horizontally in the Y-direction to reach the various nano-structures. As discussed above, there may be many nanostructures disposed between the nano-structures 170A and 170C, as well as between the nano-structures 170B and 170D. Thus, the electrical signal propagating through the gate via 320 may only need to travel a distance 220 to reach the nano-structure 170A but may have to travel a much longer distance 221 to reach the nano-structure 170C. Likewise, the electrical signal propagating through the gate via 320 may only need to travel a small distance 220 to reach the nano-structure 170B but may have to travel the much longer distance 221 to reach the nano-structure 170D.

In conventional embodiments where the conductive capping layer 300 is not implemented, the propagation of the electrical signal would take place mostly within the metal-containing gate electrode of the HKMG structure 140. Although the metal-containing gate electrode is electrically conductive, such a horizontal propagation path (along the Y-direction) of the electrical signal may still result in signal loss due to the inherent electrical resistance of the metal-containing gate electrode. Alternatively stated, the horizontal propagation of the electrical signal between the gate via 320 and the nano-structures corresponds to gate resistance experienced by the respective nano-structures. The signal loss or gate resistance may be even worse for the nano-structures at or near the end of the row of nano-structures, such as the nano-structure 170C that is disposed at the end of the row. In other words, even if the signal loss or gate resistance experienced by the nano-structure 170A is tolerable (since it is disposed relatively close to the gate via 320), the signal loss or gate resistance experienced by the nano-structure 170C may be too significant to overlook. As a result, the nano-structures herein, and especially the nano-structures that are far away from the gate via 320 (such as the nano-structures 170C and 170D), could experience degraded device performance such as slower device speed, etc, since resistance is inversely correlated with device speed.

To overcome the problems discussed above, the present disclosure implements the conductive capping layer 300 to reduce the gate resistance experienced by the nano-structures. As discussed above, the conductive capping layer 300 has a lower resistivity than the gate via 320, as well as a lower resistivity than the metal layers of the HKMG structure 140. As such, the conductive capping layer 300 can conductive electricity better than the HKMG structure 140 with reduced signal loss. Note that the conductive capping layer 300 is also formed over a substantial entirety of the HKMG structure 140. As such, to reach even the farthest nano-structures 170C or 170D, the horizontal propagation of the electrical signals may take place mostly within the conductive capping layer 300, rather than through the more resistive metal layers of the HKMG structure 140. Therefore, even the most remotely located nano-structures 170C and 170D (from the gate via 320) may experience a substantial reduction in gate resistance and signal loss. In this manner, the device performance (particularly for the devices corresponding to the nano-structures 170C and 170D) may be improved.

FIGS. 3-15 illustrate diagrammatic fragmentary cross-sectional views of a portion of the IC device 200 at various stages of fabrication according to various embodiments of the present disclosure. Whereas FIG. 2 illustrates its cross-sectional view along a Y-Z plane, FIGS. 3-15 illustrate the cross-sectional views along a X-Z plane, and as such, FIGS. 3-15 may be referred to as X-cuts. For example, the cross-sectional side views of the IC device in FIGS. 3-15 may be obtained by taking a cross-sectional cut along the cutline B-B' shown in FIG. 1B.

Figure 3:
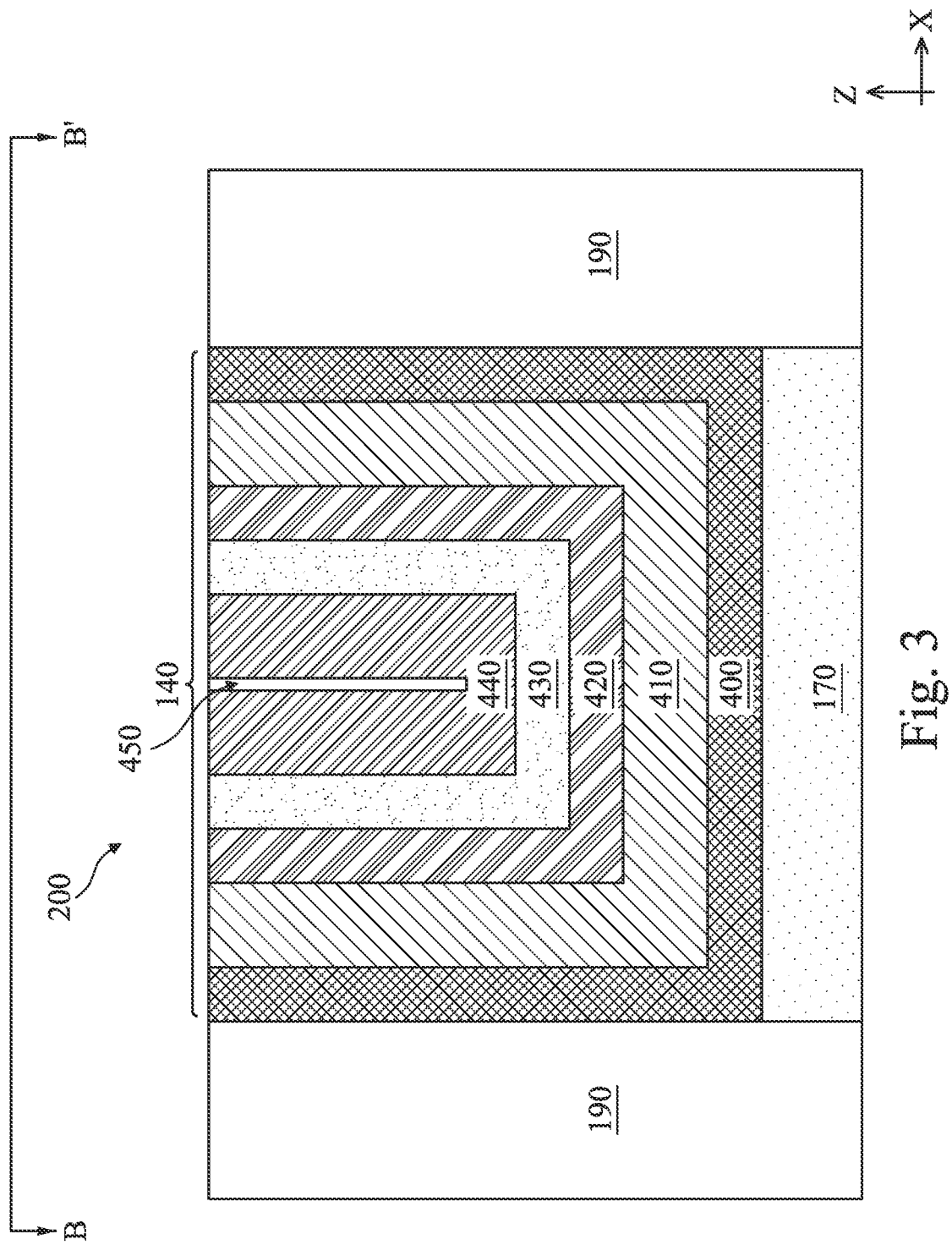

Referring to FIG. 3, the IC device 200 includes an active region, which may be in the form of the nano-structure 170 discussed above in some embodiments, or may be the fin structures 120 in some other embodiments. The dielectric structure 190 surrounds the nano-structure 170 laterally in the X-direction. In some embodiments, the dielectric structure 190 may include different dielectric components, for example, the ILD 185 and the gate spacers 160 discussed above. The HKMG structure 140 is formed over the nano-structure 170. In some embodiments, the HKMG structure 140 is formed as a part of a gate replacement process, in which a dummy gate structure is formed first and subsequently replaced by the HKMG structure. In that regard, the initially-formed dummy gate structure may include a dummy gate dielectric (e.g., a silicon oxide gate dielectric) and a dummy polysilicon gate electrode. After the formation of source/drain regions, the dummy gate structure is removed (e.g., via one or more etching processes), thereby forming an opening or recess within the dielectric structure 190. The opening or recess also exposes an upper surface of the nano-structure 170. The HKMG structure 140 is then formed in the opening to replace the removed dummy gate structure.

In the embodiment shown in FIG. 3, the HKMG structure 140 includes a high-k gate dielectric layer 400 formed over the nano-structure 170, a work function (WF) metal layer 410 formed over the high-k gate dielectric layer 400, a conductive layer 420 formed over the WF metal layer 410, a protection layer 430 formed over the conductive layer 420, and a glue layer 440 formed over the protection layer 430. In some embodiments, an interfacial layer may also be formed between the nano-structure 170 and the high-k gate dielectric layer 410.

The high-k gate dielectric layer 400 includes a high-k dielectric material having a dielectric constant greater than that of silicon oxide. The high-k gate dielectric layer 400 may be formed by one or more suitable deposition processes, such as an atomic layer deposition (ALD) process, a plasma enhanced atomic layer deposition (PEALD) process, a chemical vapor deposition (CVD) process, or a physical vapor deposition (PVD) process, or combinations thereof.

The WF metal layer 410 may include a metal or metal compound configured to tune a work function of a transistor. Non-limiting example materials for the WF metal layer 410 may include titanium nitride (TiN), Titanium aluminide (TiAl), tantalum nitride (TaN), titanium carbide (Tic), tantalum carbide (TaC), tungsten carbide (WC), aluminum titanium nitride (TiAlN), zirconium aluminide (ZrAl), tungsten aluminide (WAl), tantalum aluminide (TaAl), hafnium aluminide (HfAl), or combinations thereof. The WF metal layer 410 may also be formed using one or more suitable deposition processes such as ALD, CVD, PVD, or combinations thereof.

The conductive layer 420 includes an electrically conductive material that also has good gap-filling performance. In some embodiments, the conductive layer 420 includes titanium nitride (TiN). In some embodiments, the conductive layer 420 may also be formed using the same processing chamber (e.g., an ALD chamber, a PVD chamber, a CVD chamber, etc.) that was used to form the WF metal layer 410. As such, the conductive layer 420 may also be referred to as an in-situ layer. The conductive layer 420 may be considered a portion of the fill metal discussed above, which serves as a main conductive portion of the metal gate electrode of the HKMG structure 140.

The protection layer 430 includes a dielectric material. In some embodiments, the protection layer 430 may include silicon oxide ($SiO_2$). The protection layer 430 provides protection for the layers below, for example to the conductive layer 420 and the WF metal layer 410. The protection layer 430 may also be formed using one or more suitable deposition processes such as ALD, CVD, PVD, or combinations thereof.

The glue layer 440 also includes a conductive material. In some embodiments, the glue layer 440 includes titanium nitride. The material composition of the glue layer 440 is configured to enhance adhesion with the conductive capping layer 300 (see FIG. 2) that will be formed over the glue layer 440 in a subsequent process. Without the glue layer 440, the conductive capping layer 300 may not have sufficient adhesion with the metal gate electrode of the HKMG structure 140. In other words, had the glue layer 440 not been formed, the conductive capping layer 300 may peel off from the metal gate electrode of the HKMG structure 140 too easily. The glue layer 440 may also be considered a portion of the fill metal of the metal gate electrode. The glue layer 440 may be formed using one or more suitable deposition processes such as ALD, CVD, PVD, or combinations thereof.

In the illustrated embodiment, a narrow gap 450 (or a seam) may also exist within the HKMG structure 140, for example, within the glue layer 440. In some embodiments, such a gap 450 may be formed due to the gap-filling capabilities of the glue layer 440. In some embodiments, the gap 450 may be eliminated altogether.

Figure 4:
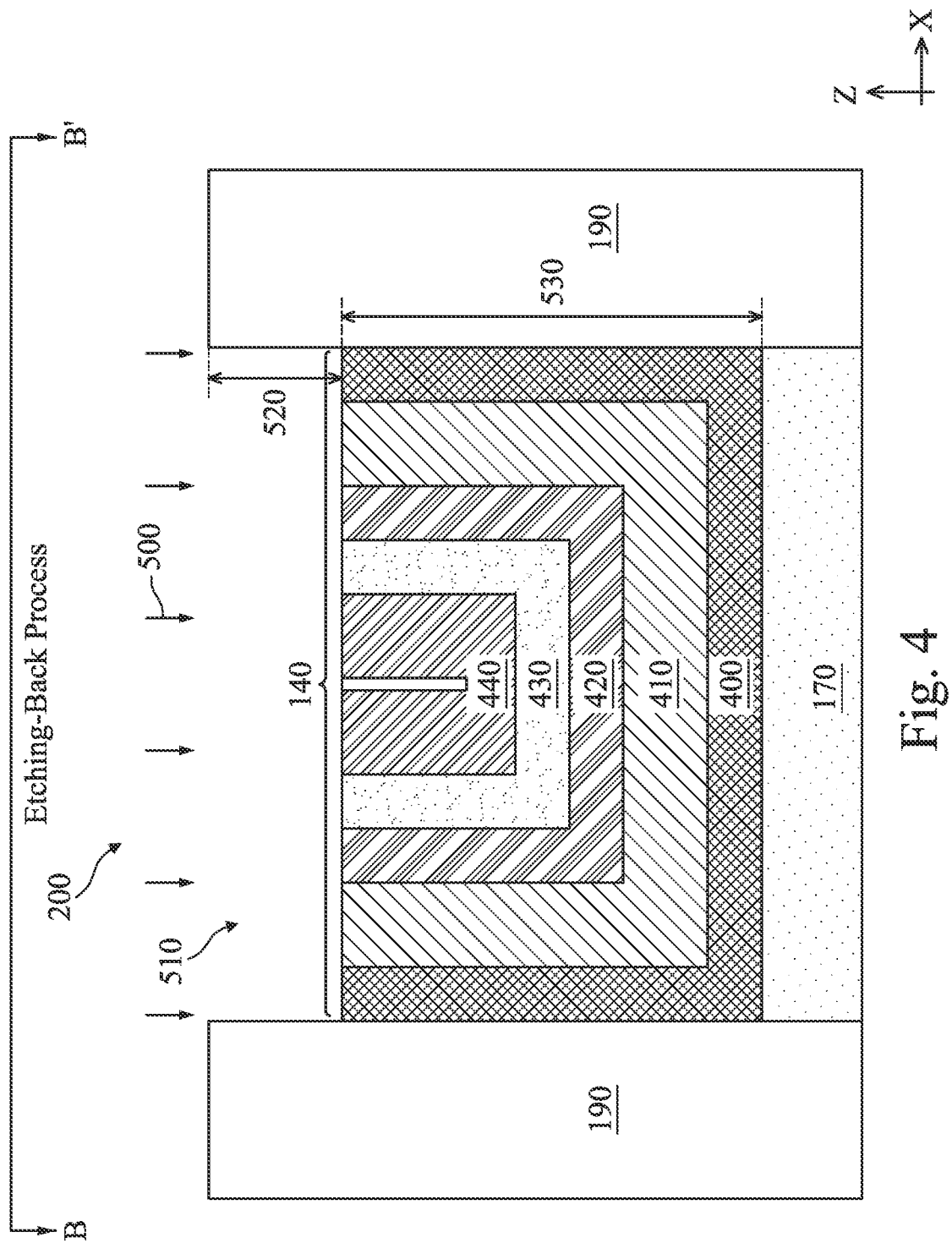

Referring now to FIG. 4, an etching-back process 500 is performed to the IC device 200. The etching-back process 500 partially etches away the HKMG structure 140 to reduce the height of the HKMG structure 140 in the Z-direction. The etching-back process 500 may have substantially similar etching rates for the layers 400, 410, 420, 430, and 440, so that the reduction in height due to the etching-back process 500 may be substantially similar for all the layers 400-440.

The partial removal of the layers 400-440 forms an opening 510, where the side surfaces of the opening 510 are defined by the dielectric structure 190, and the bottom surface of the opening 510 is defined by the upper surfaces of the layers 400-440. The opening 510 has a depth 520 measured in the Z-direction. The depth 520 is carefully configured to be not too deep nor too shallow. This is because the opening 510 is formed so that it can be filled by the conductive capping layer 300 in a subsequent process. As such, the depth 520 of the opening 510 translates into the thickness of the conductive capping layer 300. If the depth 520 is too high, the conductive capping layer 300 will be too thick and the HKMG structure 140 will be too thin, which may adversely affect the performance or operation of the HKMG structure 140. On the other hand, if the depth 520 is too low, the conductive capping layer 300 will be too thin, and it may not adequately serve its purpose of reducing the gate resistance. In some embodiments, the depth 520 is in a range between about 20 nm and about 70 nm, for example, between about 30 nm and about 60 nm. The depth 520 may also be defined relative to a height 530 of a remaining portion of the HKMG structure 140. In some embodiments, a ratio between the depth 520 and the height 530 is in a range between about 5 nm and about 25 nm. As discussed above, these ranges involving the depth 520 are not randomly chosen but specifically configured herein to ensure that the soon-to-be-formed conductive capping layer 300 is sufficiently thick to reduce the gate resistance, while preserving a sufficient amount of HKMG structure 140 so that the intended operations involving the gate or device performance is not compromised.

Figure 5:
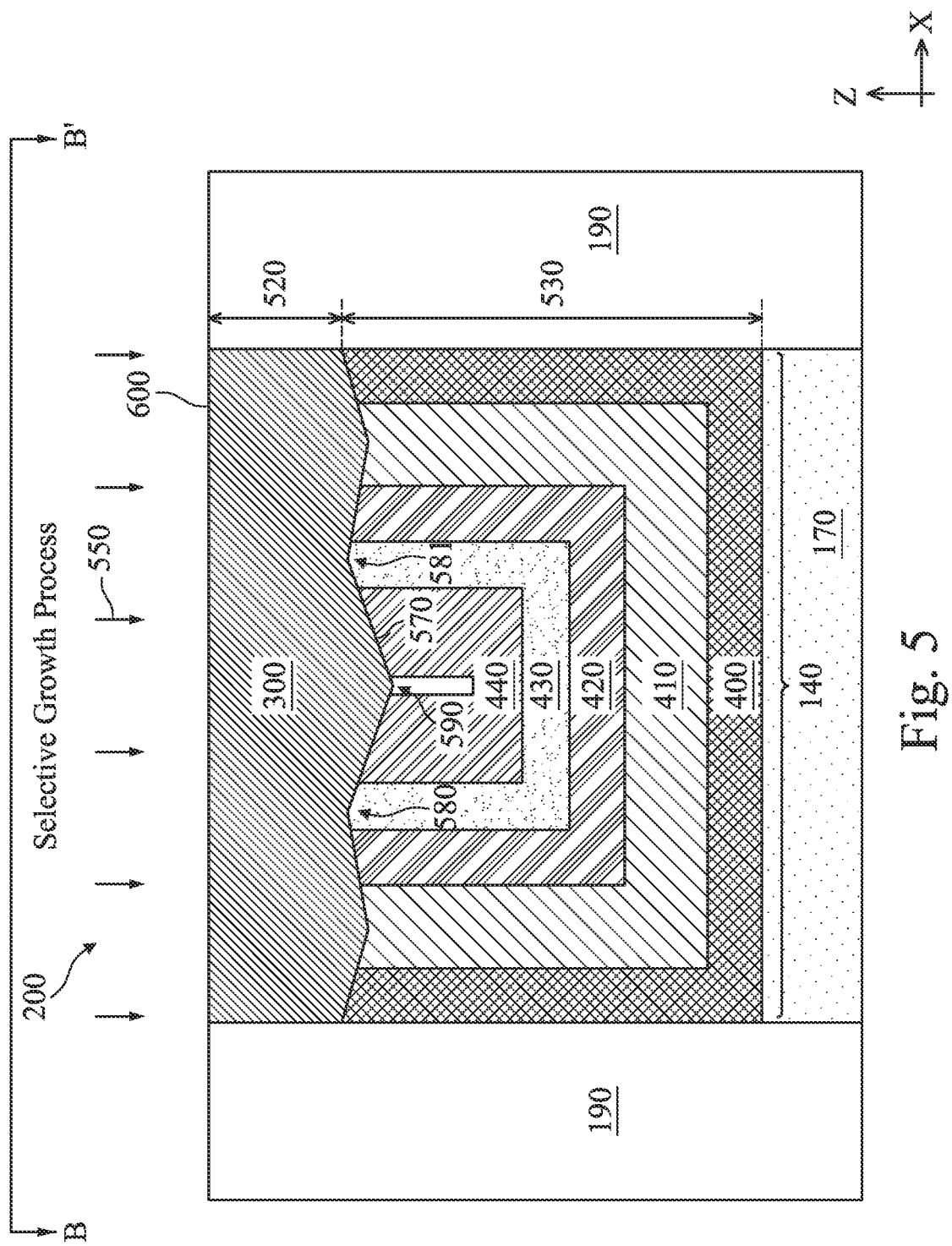

Referring now to FIG. 5, a selective growth process 550 is performed to the IC device 200 to form the conductive capping layer 300 over the HKMG structure 140. In some embodiments, the selective growth process 550 is performed in an atomic layer deposition (ALD) tool, with the precursors selected from the group consisting of: WC's, $H_2$, $WF_6$, and SiH$_4$. The selective growth process 550 is also performed at a process temperature in a range between about 400 degrees Celsius and about 500 degrees Celsius, for a process duration between about 2 minutes and about 30 minutes, at a process pressure in a range between about 2 Torr and about 500 Torr.

The selective growth process 550 is configured to grow the materials of the conductive capping layer 300 directly on upper surfaces of the WF metal layer 410, the conductive layer 420, and the glue layer 440, but not directly on the upper surfaces of the high-k gate dielectric layer 400 or the protection layer 430. In some embodiments, the selective growth process 550 is configured to grow fluorine-free-tungsten (FFW) as the material of the conductive capping layer 300. In other embodiments, the selective growth process 550 may be configured to grow another tungsten-containing material or another suitable material as the conductive capping layer 300. Regardless of the specific type of material grown as the conductive capping layer 300, it is understood that the conductive capping layer 300 has a lower resistivity than the metal gate electrode of the HKMG structure 140, for example, a lower resistivity than each of the layers 400, 410, 420, 430, and 440.

Due to the fact that the conductive capping layer 300 is selectively grown directly on the layers 410, 420, and 440, but not directly on the layers 400 or 430, the conductive capping layer 300 may exhibit certain unique physical characteristics. For example, a bottom surface 570 of the conductive capping layer 300 may have concave recesses 580-581 that are each recessed in the Z-direction. The locations of the recesses 580-581 correspond to (or are aligned with) the locations of the protection layer 430. This is because while the conductive capping layer 300 is not grown directly on the upper surfaces of the protection layer 430 (since the protection layer 430 is not conductive), the portions of the conductive layer capping 300 grown directly on the upper surfaces of the layers 420 and 440 may extend laterally (in the X-direction), such that they eventually merge into one another. As such, portions of the conductive capping layer 300 are still disposed over the protection layer 430, but these portions are formed at a more elevated location vertically, thereby resulting in the recesses 580-581. In some embodiments, the bottom surface 570 of the conductive capping layer 300 may further include a protrusion 590 that protrude downward vertically in the Z-direction. In other words, the protrusion 590 may protrude into the gap 450.

Note that no planarization process is needed to planarize an upper surface 600 of the conductive capping layer 300, since the selective growth process 550 may be able to tune a thickness (measured vertically in the Z-direction) of the conductive capping layer 300 with relative precision. As such, the selective growth process 550 may stop once the upper surface 600 is substantially co-planar with the upper surfaces of the dielectric structure 190. Having said that, it is understood that the upper surface 600 of the conductive capping layer 300 may or may not be perfectly flat, and it may include a curvature in certain embodiments. For example, the upper surface 600 may be downwardly curved (in the Z-direction) in some embodiments, such that it has a lower vertical elevation at the middle than at the edges.

Also note that a thickness of the conductive capping layer 300 may substantially correspond to the depth 520 of the opening 510 discussed above with reference to FIG. 4. As such, the reference numeral 520 may also be referred to as a thickness 520 of the conductive capping layer 300. As such, the thickness 520 of the conductive capping layer 300 is in a range between about 2 nm and about 8 nm, and a ratio between the thickness 520 and the height 530 of the remaining portion of the HKMG structure 140 is in a range between about 50% and about 100%. Again, these ranges are not randomly chosen but specifically configured to ensure that the conductive capping layer 300 may achieve sufficient gate resistance reduction without interfering with the desired operations of the transistors herein.

Figure 6:
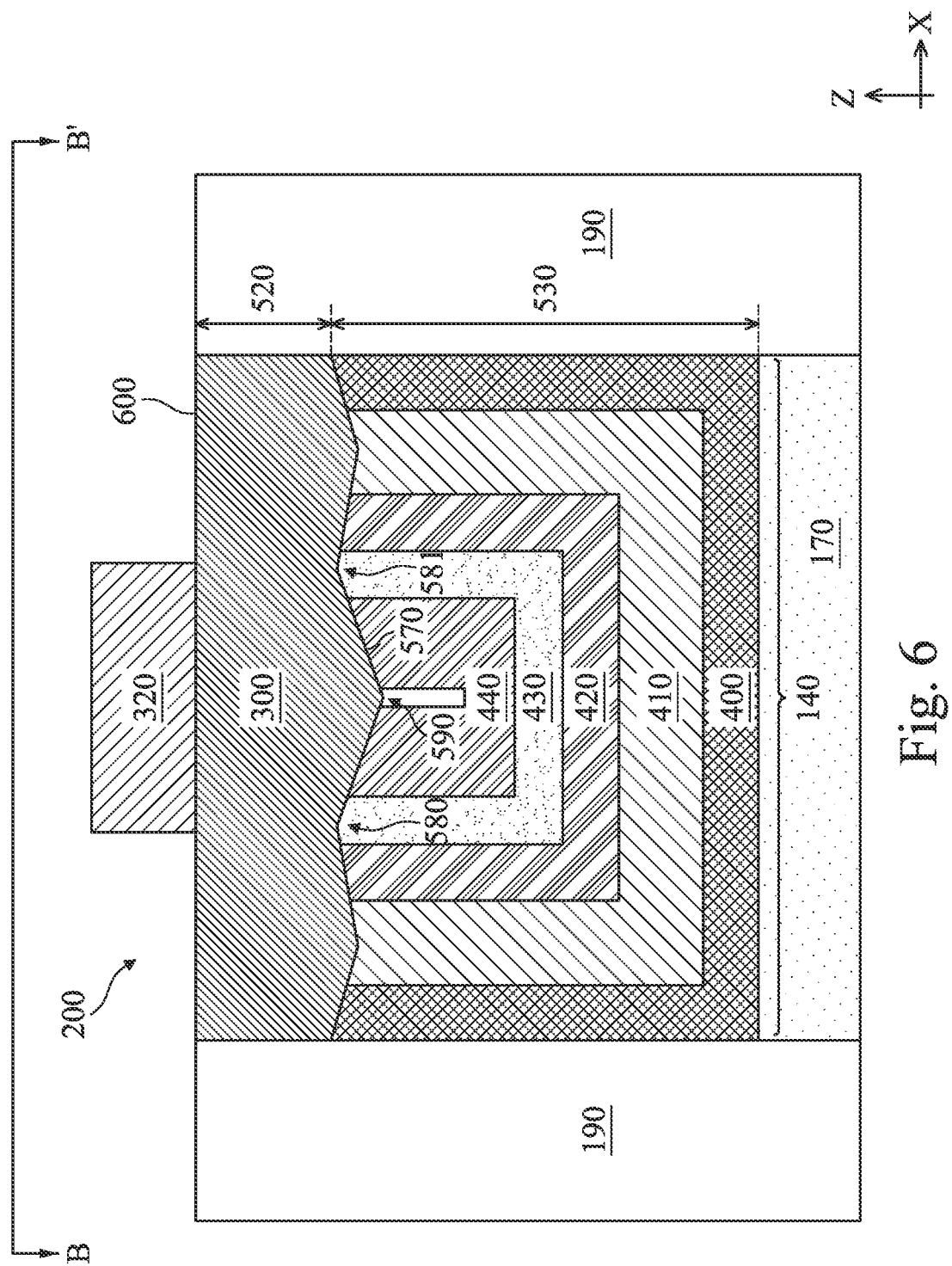

Referring now to FIG. 6, the gate via 320 discussed above is formed over the upper surface 600 of the conductive capping layer 300. As discussed above, the gate via 320 provides electrical connectivity to the HKMG structure 140 and the nano-structure 170 below. Due to the formation of the low-resistance conductive capping layer 300, signals propagating through the gate via 320 may travel to each of the nano-structures 170 through the conductive capping layer 300. Since the resistivity of the conductive capping layer 300 is very low, even the farthest nano-structure 170 (e.g., nano-structures 170C or 170D in FIG. 2) from the gate via 320 would not experience much signal loss, and therefore the gate resistance is substantially reduced, and device speed is improved.

Figure 7:
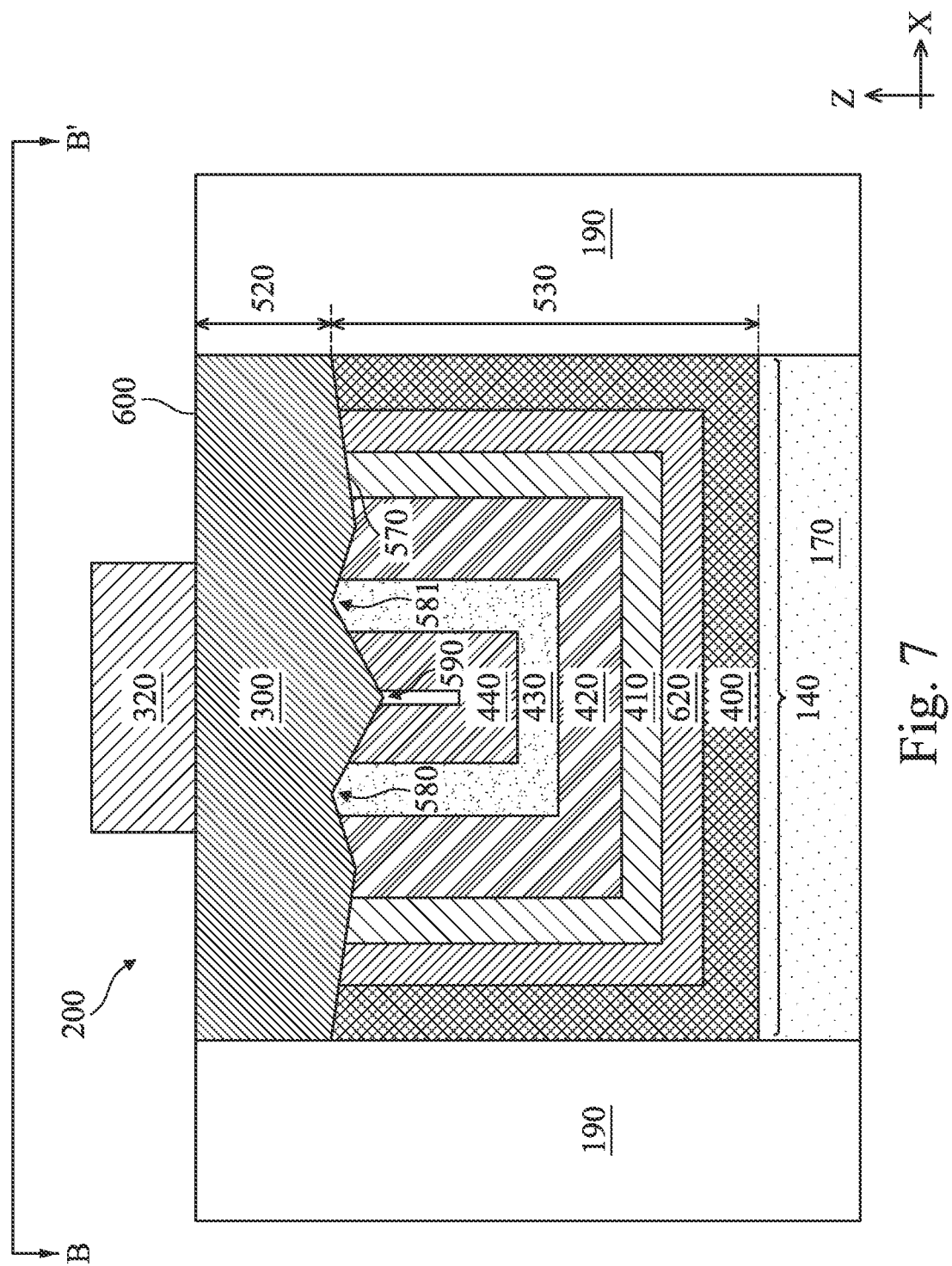

The embodiments discussed above in association with FIGS. 3-6 correspond to a semiconductor device having a relatively low threshold voltage. As such, the embodiments shown in FIGS. 3-6 may be referred to as a low-threshold-voltage embodiment. FIG. 7 illustrates another embodiment of the IC device 200 having a medium threshold voltage (i.e., greater than the low threshold voltage of the embodiments of FIGS. 3-6). As such, the embodiment of FIG. 7 may be referred to as a medium-threshold-voltage embodiment. For reasons of consistency and clarity, similar components appearing in FIGS. 3-7 will be labeled the same.

Referring to FIG. 7, which is the X-cut view of the IC device 200, the HKMG structure 140 of the IC device 200 includes the high-k gate dielectric layer 400, the WF metal layer 410, the conductive layer 420, the protection layer 430, and the glue layer 440. Unlike the low-threshold-voltage embodiment of FIG. 6, however, the medium-threshold-voltage embodiment of FIG. 7 further includes a conductive layer 620 that is formed between the high-k gate dielectric layer 400 and the WF metal layer 410. The addition of the conductive layer 620 helps tune the threshold voltage of the embodiment of FIG. 7 to be a greater voltage than the embodiment of FIG. 6 (e.g., a larger positive value for NFETS or a larger magnitude of a negative value for PFETs).

At the stage of FIG. 7, the IC device 200 has undergone the same fabrication processes discussed above with reference to FIGS. 4-6, such as the etching-back process 500, the selective growth process 550, and the formation of the gate via 320. The selective growth process 550 forms the conductive capping layer 300 over the HKMG structure 140. Note that the bottom surface 570 of the conductive capping layer 300 may still have concave recesses 580-581 that correspond to the locations of the protection layer 430, since the conductive capping layer 300 is not grown directly on the upper surfaces of the protection layer 430. The bottom surface 570 of the conductive capping layer 300 also includes the downward protrusion 590 into the gap 450.

Figure 8:
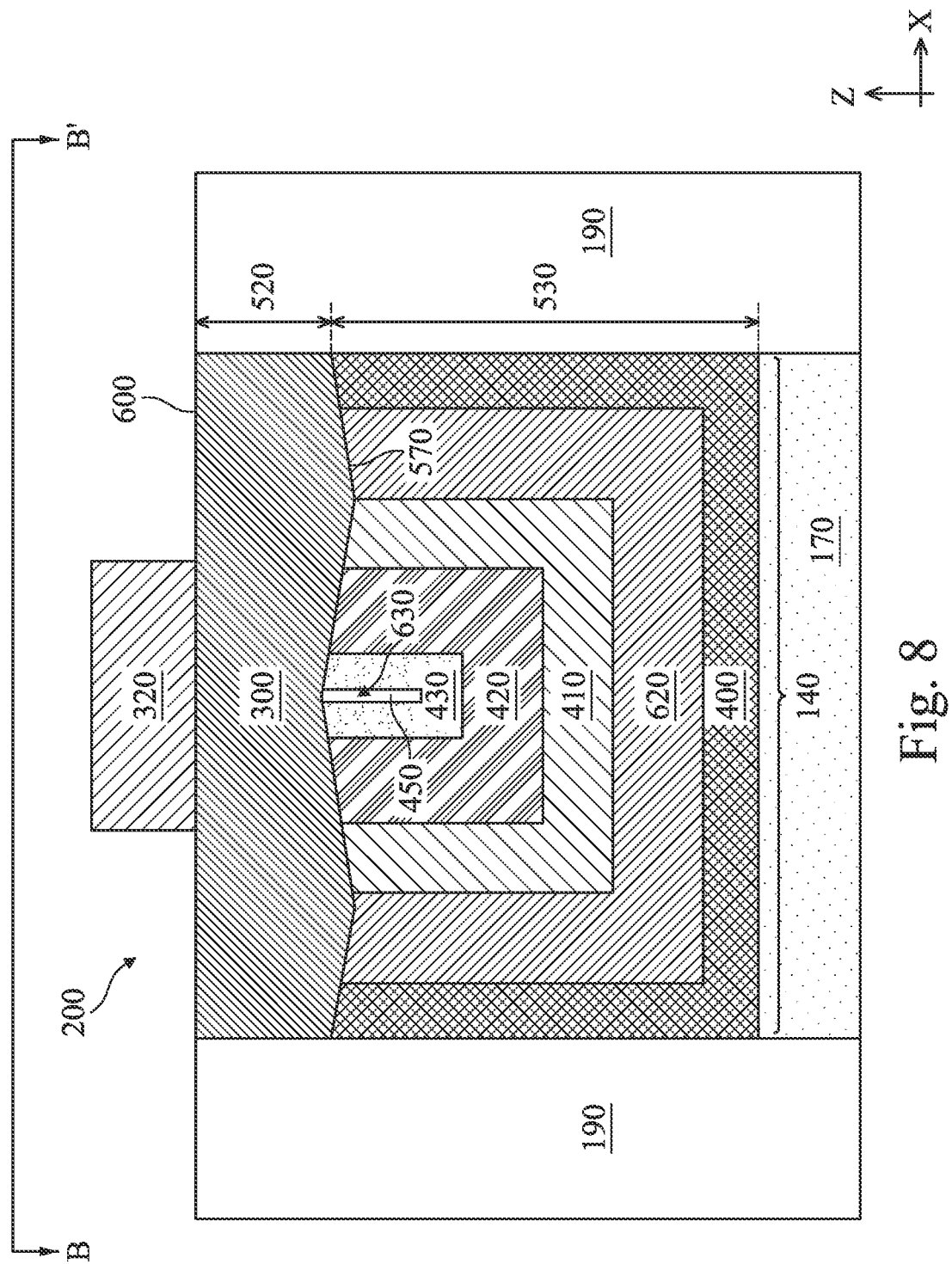

FIG. 8 further illustrates another embodiment of the IC device 200, where the HKMG structure 140 is configured to have a relatively high threshold voltage compared to the embodiments of FIG. 6 and FIG. 7. As such, the embodiment shown in FIG. 8 may be referred to as a high-thresholdvoltage embodiment. For reasons of consistency and clarity, similar components appearing in FIGS. 5-8 will be labeled the same.

Referring to FIG. 8, which is the X-cut view of the IC device 200, the HKMG structure 140 of the IC device 200 includes the high-k gate dielectric layer 400, the conductive layer 620, the WF metal layer 410, the conductive layer 420, and the protection layer 430. Unlike the low-threshold-voltage embodiment of FIG. 6 and the medium-threshold-voltage embodiment of FIG. 7, however, the high-threshold-voltage embodiment of FIG. 8 does not include the glue layer 440. In addition, the conductive layer 620 of FIG. 8 is substantially thicker than the conductive layer 620 in the embodiment of FIG. 7. Such a configuration of the HKMG structure 140 helps tune the threshold voltage of the embodiment of FIG. 8 to be a greater voltage than the embodiments of FIGS. 6-7 (e.g., a larger positive value for NFETS or a larger magnitude of a negative value for PFETs).

At the stage of FIG. 8, the IC device 200 has undergone the same fabrication processes discussed above with reference to FIGS. 4-6, such as the etching-back process 500, the selective growth process 550, and the formation of the gate via 320. The selective growth process 550 forms the conductive capping layer 300 over the HKMG structure 140. Due at least in part to the elimination of the glue layer 440, the bottom surface 570 of the conductive capping layer 300 now has a concave recess 630 (recessed upwardly in the Z-direction). The recess 630 generally corresponds to the location of the protection layer 430, and a center of the recess 630 corresponds to the location of the gap 450. Again, the formation of the recess 630 is attributed to the fact that the conductive capping layer 300 is not grown directly on the upper surfaces of the protection layer 430 by the selective growth process 550.

The embodiments discussed above with reference to FIGS. 3-8 pertain to a first process flow to form the conductive capping layer 300. FIGS. 9-15 pertain to a second process flow to form the conductive capping layer 300. Again, for reasons of consistency and clarity, similar components appearing in both the first process flow discussed above and the second process flow discussed below will be labeled the same.

Figure 9:
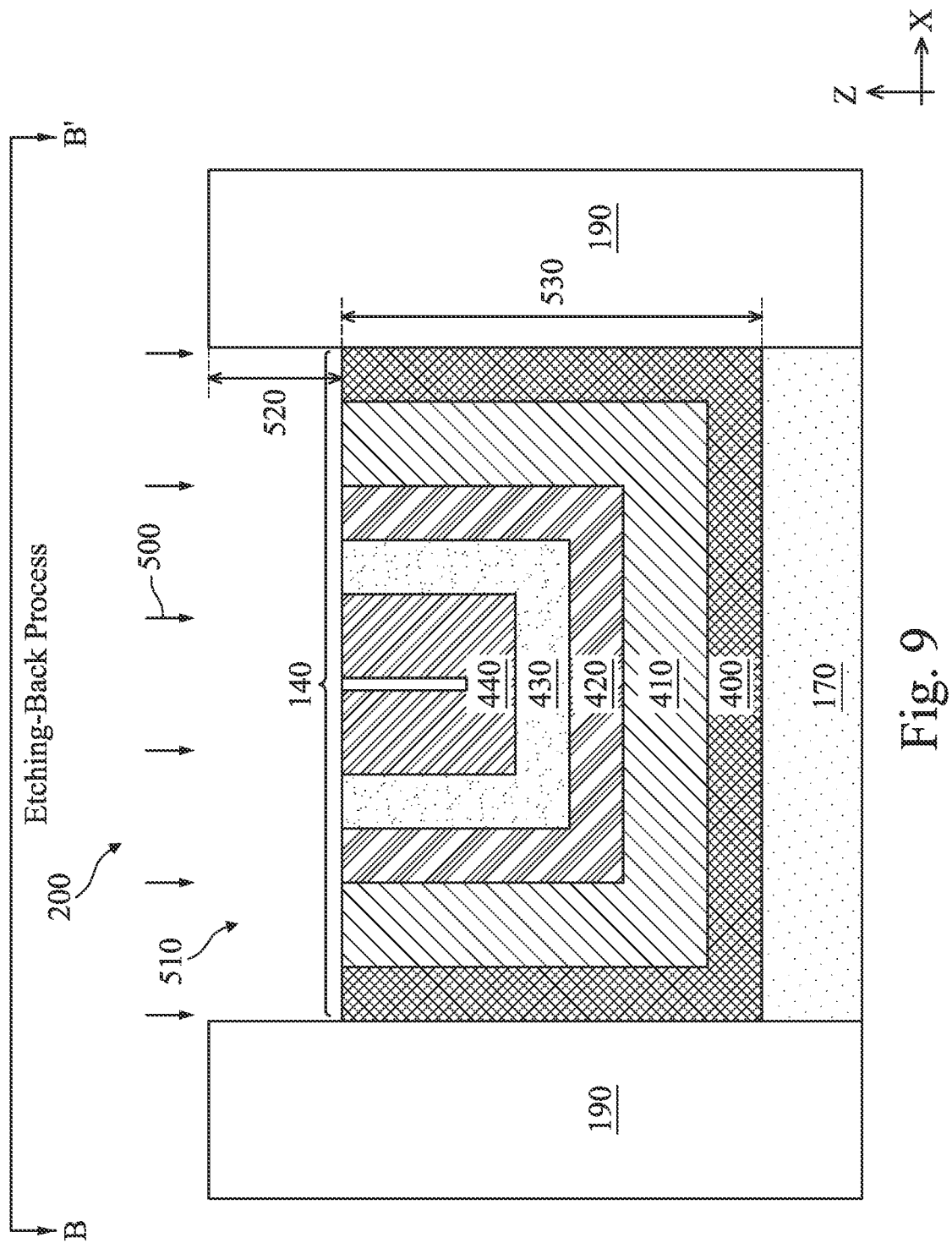

Referring now to FIG. 9, which also illustrates the X-cut view of the IC device 200, the HKMG structure 140 of the IC device 200 also undergoes the etching-back process 500. As a result, the opening 510 is formed by the partial removal of the HKMG structure 140.

Figure 10:
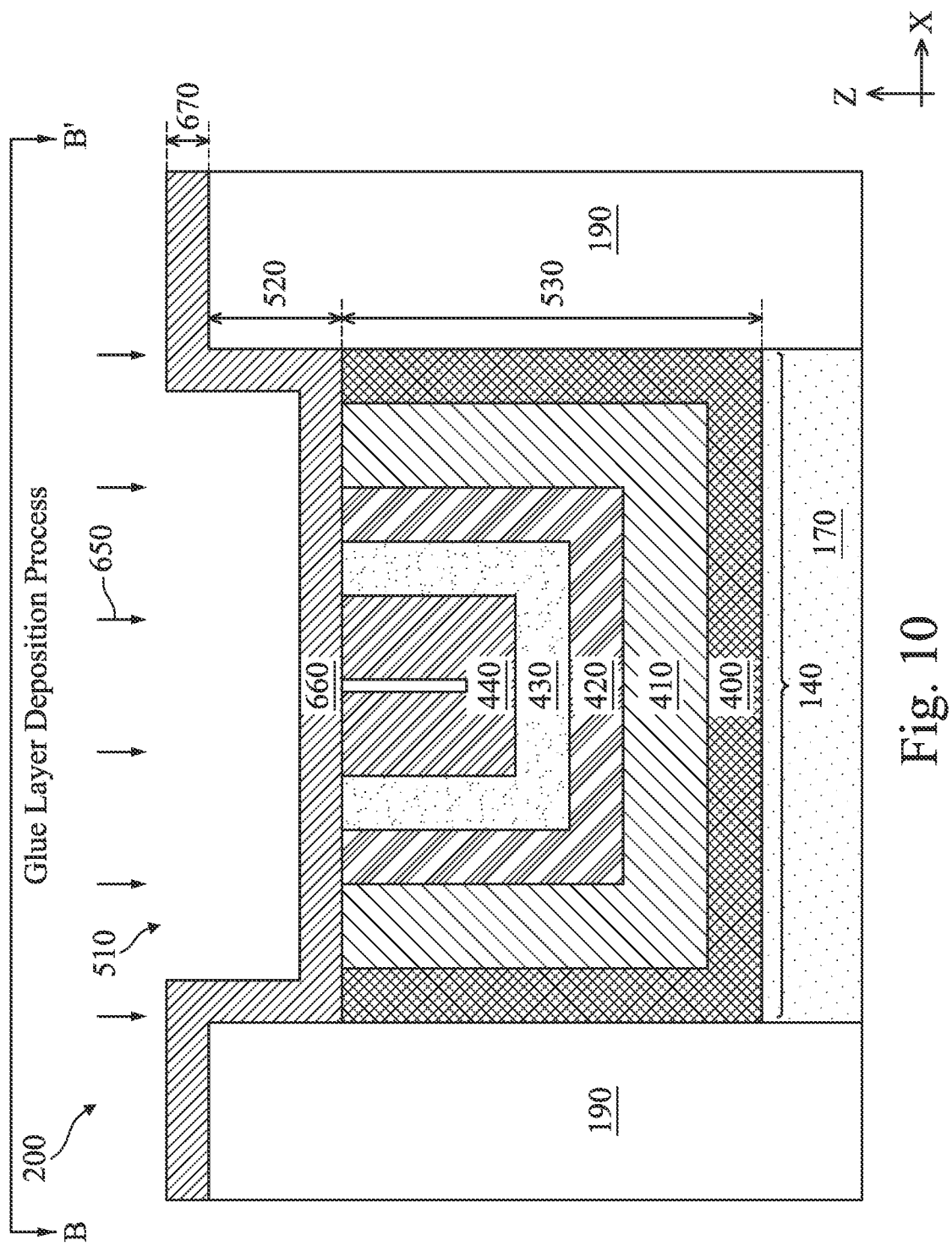

Referring now to FIG. 10, a glue layer deposition process 650 is performed to the IC device 200 to deposit a glue layer 660 in the opening 510. The glue layer deposition process 650 may include an ALD process, a CVD process, a PVD process, or combinations thereof. In some embodiments, the glue layer 660 has a material composition that is similar to (or the same as) the glue layer 440. For example, the glue layer 660 may also have a titanium nitride material composition. The glue layer 660 partially fills the opening 510. For example, the glue layer 660 is formed on side surfaces and upper surfaces of the dielectric structure 190 and on upper surfaces of the etched-back HKMG structure 140. Since the deposition process 650 is not a selective deposition process, portions of the glue layer 660 are formed on all of the layers 400-440 of the HKMG structure 140.

The glue layer deposition process 650 is configured to form the glue layer 660 to have a thickness 670, where the thickness 670 is in a range between about 1 nm and about 10 nm. Such a thickness range is not randomly chosen but specifically configured to maximize device performance. In more detail, as will be discussed below, the remaining portion of the opening 510 will be filled by the conductive capping layer 300. The glue layer 660 is formed herein to increase the adhesion with the conductive capping layer 300, so that it does not peel off. Had the thickness 670 been too small (i.e., the glue layer 660 being formed too thin), then the glue layer 660 may not offer enough adhesion with the conductive capping layer 300, and the conductive capping layer 300 could still suffer from undesirable peeling or detachment problems. On the other hand, had the thickness 670 been too great (i.e., the glue layer 660 being formed too thick), then there may not be a sufficient amount or volume of the conductive capping layer 300 to adequately reduce the gate resistance. Here, the specifically configured thickness range of the glue layer 660 allows for the optimization of both conductive capping layer adhesion and gate resistance reduction.

Figure 11:
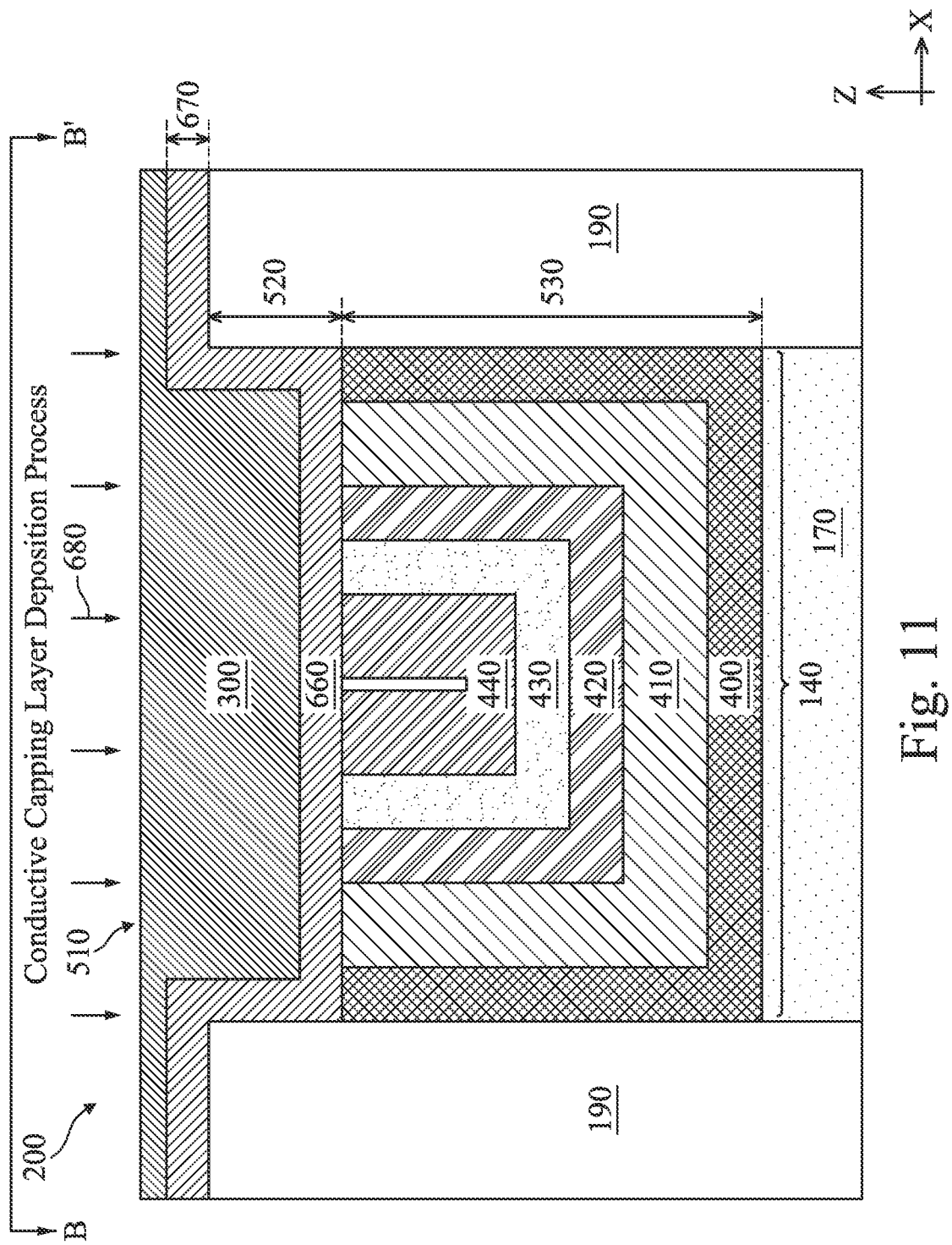

Referring now to FIG. 11, a conductive capping layer deposition process 680 is performed to the IC device 200 to deposit the conductive capping layer 300 in the opening 510. The conductive capping layer 300 is deposited on the upper surfaces and side surfaces of the glue layer 660 and completely fills the opening 510. In some embodiments, the conductive capping layer deposition process 680 may include an ALD process, a CVD process, a PVD process, or combinations thereof.

Figure 12:
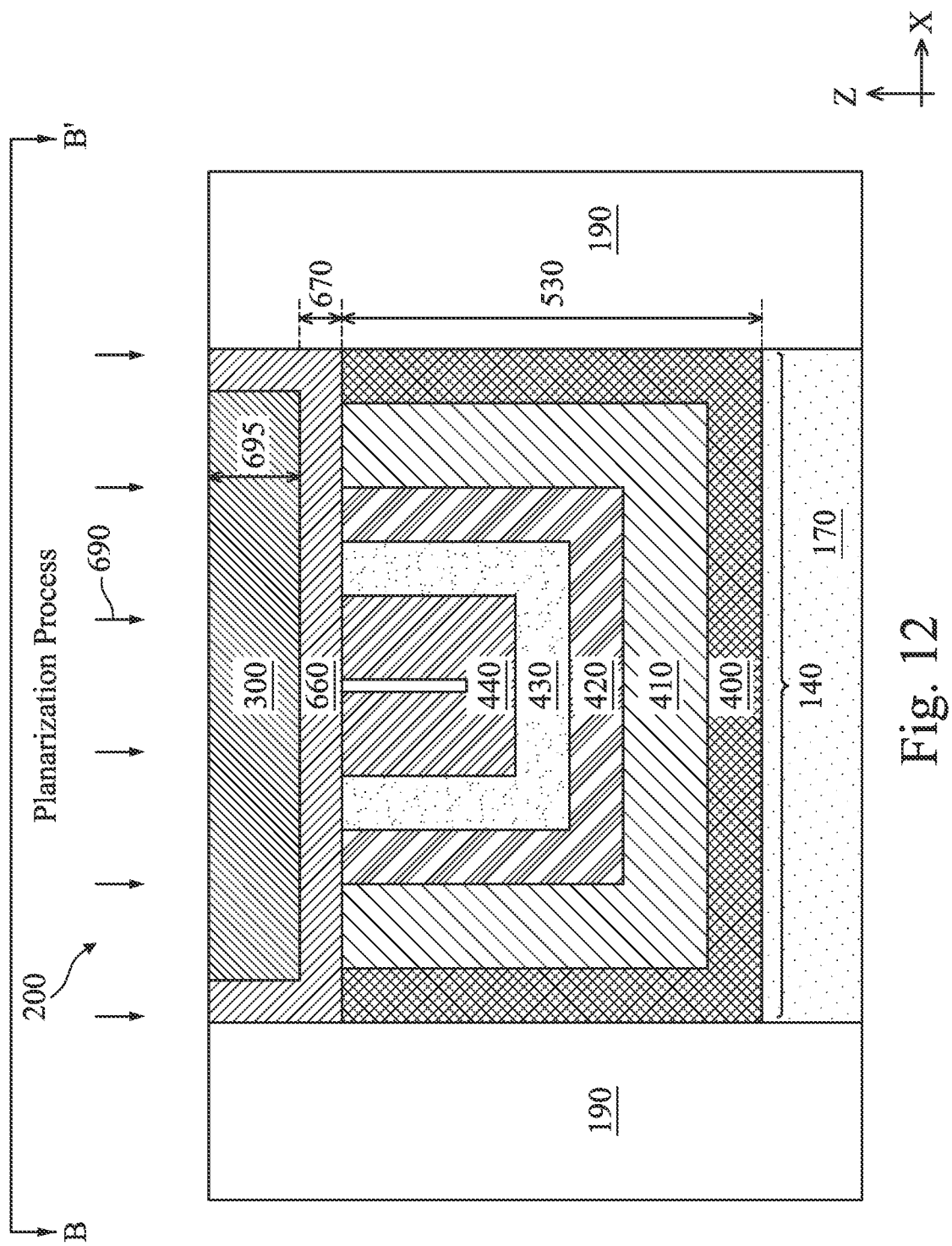

Referring now to FIG. 12, a planarization process 690 is performed to the IC device 200. In some embodiments, the planarization process 690 includes a CMP process. The planarization process 690 removes excess portions of the conductive capping layer 300 and excess portions of the glue layer 660 that are disposed over the dielectric structure 190, such that the upper surfaces of the remaining portions of the conductive capping layer 300 and the glue layer 660 are substantially co-planar with the upper surfaces of the dielectric structure 190. At this stage of fabrication, the conductive capping layer 300 has a thickness 695. In some embodiments, the thickness 695 is in a range between about 20 nm and about 60 nm. In some embodiments, a ratio of the thickness 695 of the capping layer 300 and the thickness 670 of the glue layer 660 is in a range between about 2:1 and about 60:1. Such a ratio range is not randomly chosen but specifically configured to maximize device performance, because as discussed above, the glue layer 660 should not be too thin compared to the conductive capping layer 300, as that may lead to peeling issues of the conductive capping layer 300. Nor should the glue layer 660 be too thick compared to the conductive capping layer 300, as that may lead to insufficient gate resistance reduction.

Figure 13:
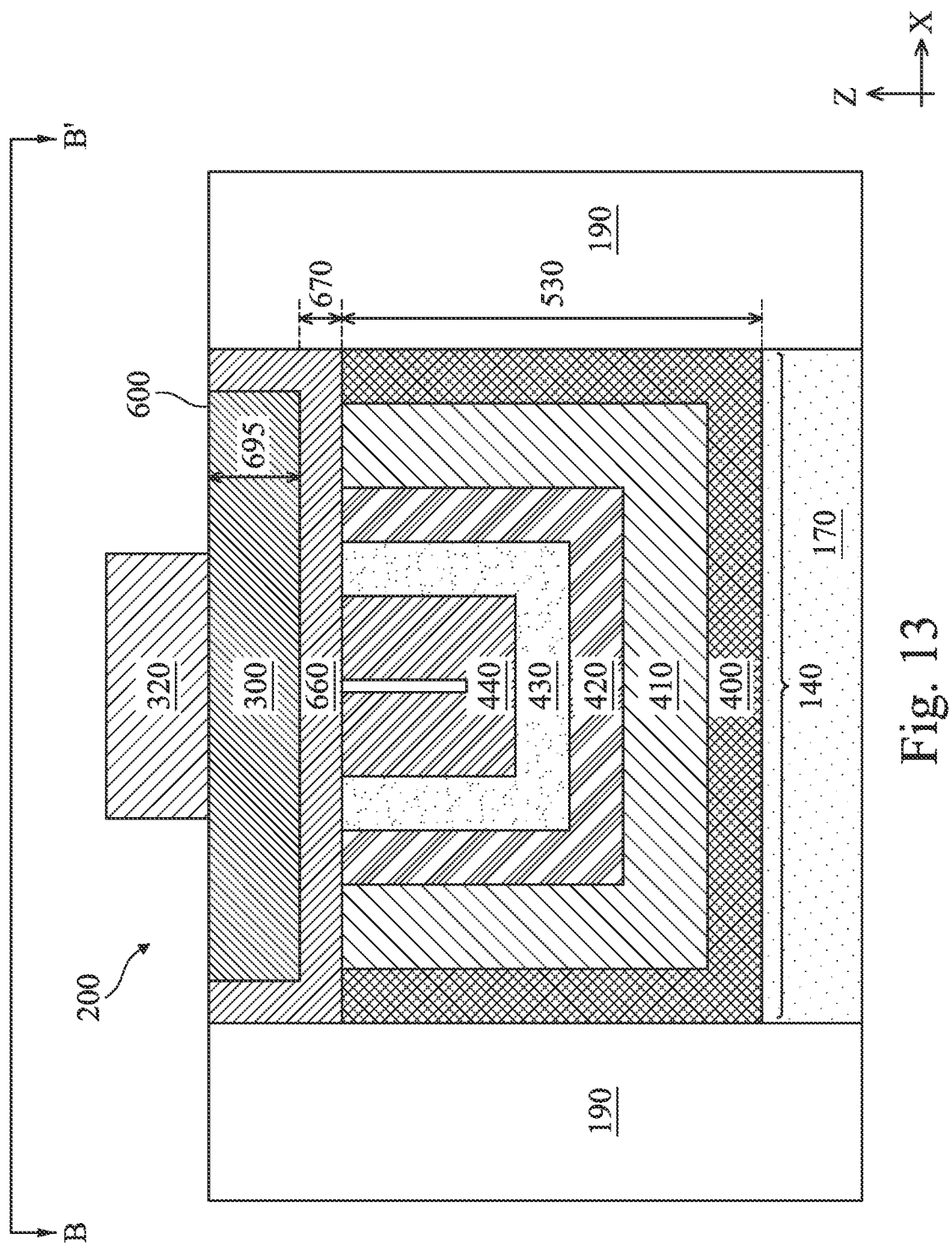

Referring now to FIG. 13, the gate via 320 discussed above is formed over the upper surface 600 of the conductive capping layer 300. As discussed above, the gate via 320 provides electrical connectivity to the HKMG structure 140 and the nano-structure 170 below. Due to the formation of the low-resistance conductive capping layer 300, the gate resistance is substantially reduced.

Figure 14:
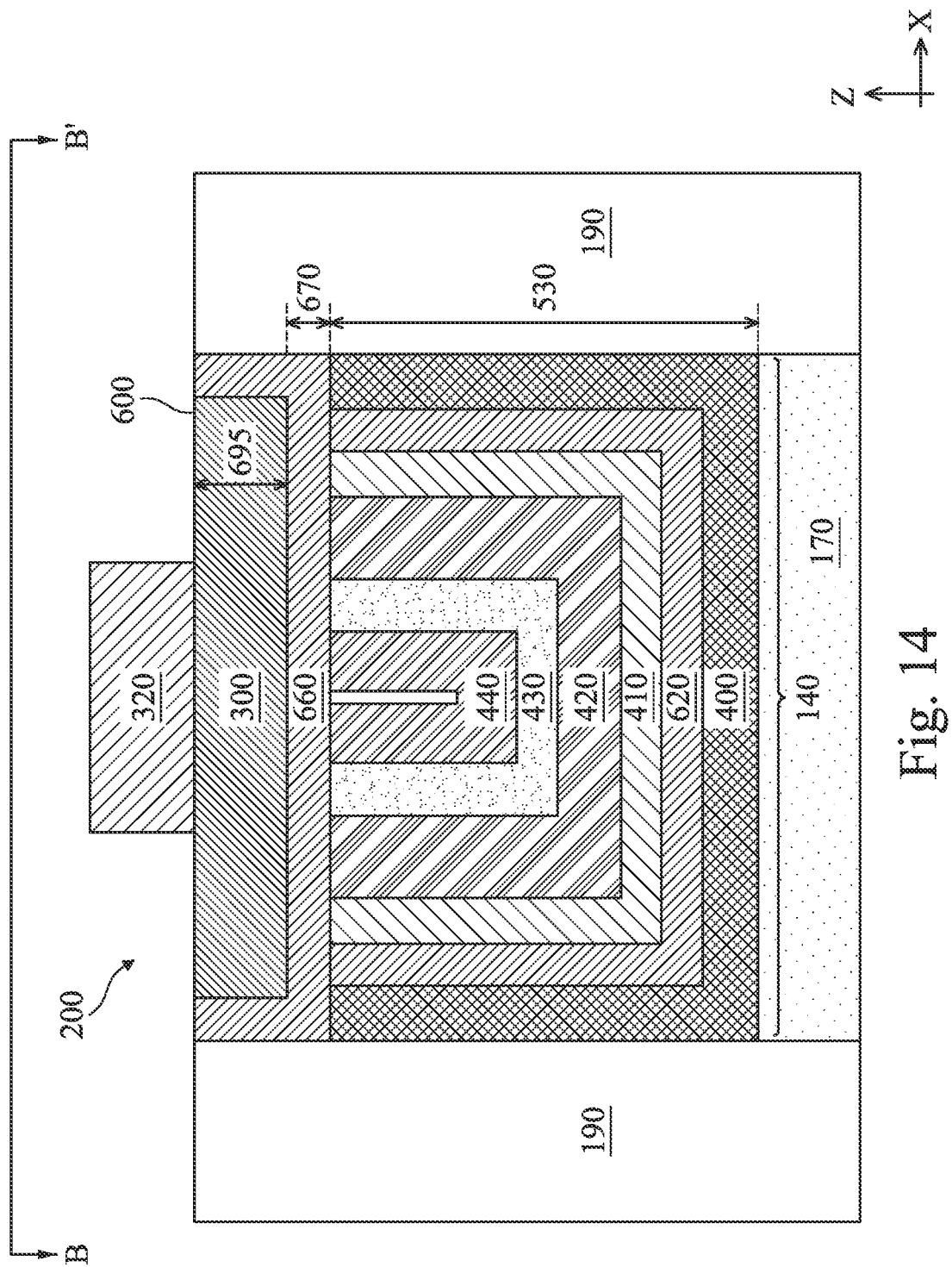

It is also understood that FIGS. 9-13 correspond to a low-threshold-voltage embodiment of the second process flow, where the HKMG structure 140 is substantially similar to the HKMG structure 140 of FIG. 6 (formed by the first process flow). FIG. 14 corresponds to a medium-threshold-voltage embodiment of the second process flow, where the HKMG structure 140 is substantially similar to the HKMG structure 140 of FIG. 7 (formed by the first process flow). Again, similar components appearing in the low-threshold-voltage embodiment of FIG. 13 and the medium-threshold-voltage embodiment of FIG. 14 are labeled the same.

As shown in the X-cut cross-sectional side view of FIG. 14, the IC device 200 of the medium-threshold-voltage embodiment has an HKMG structure 140 that includes the layers 400-440 and the layer 620 discussed above. The HKMG structure 140 is etched back, and the glue layer 660 is formed over the etched-back HKMG structure 140, and thereafter the conductive capping layer 300 is formed over the glue layer 660. A planarization process is then performed to planarize the upper surfaces of the conductive capping layer 300 and the glue layer 660 until they are substantially co-planar with the upper surfaces of the dielectric structure 190. The gate via 320 is then formed on the upper surface of the conductive capping layer 300.

Figure 15:
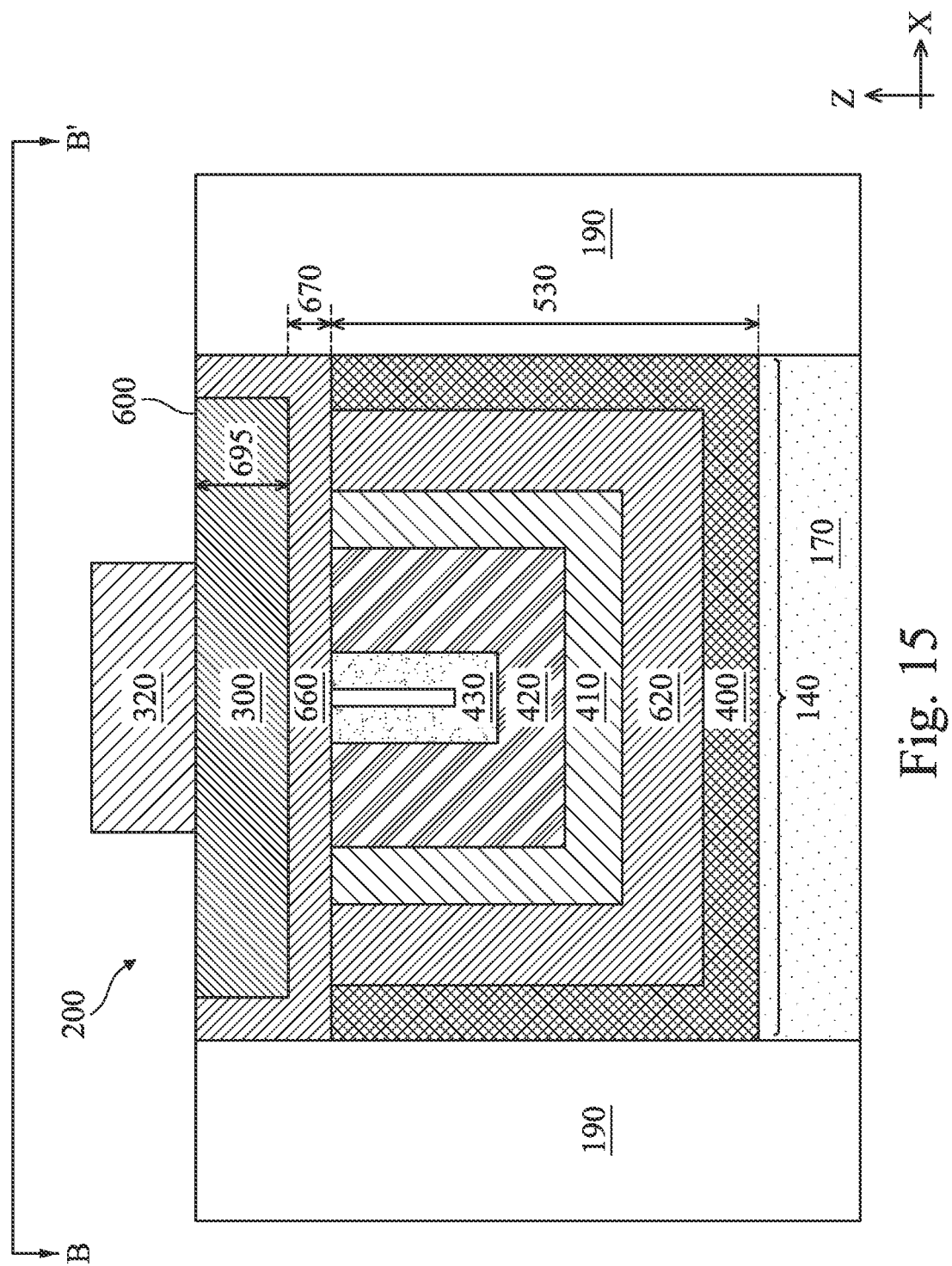

FIG. 15 is an X-cut cross-sectional side view of a high-threshold-voltage embodiment of the second process flow, where the HKMG structure 140 is substantially similar to the HKMG structure 140 of FIG. 8 (formed by the first process flow). Again, similar components appearing in the low-threshold-voltage and medium-threshold-voltage embodiments of FIG. 13-14 and the high-threshold-voltage embodiment of FIG. 15 are labeled the same. As shown in FIG. 15, the IC device 200 of the high-threshold-voltage embodiment has an HKMG structure 140 that includes the layers 400-430 and the layer 620 discussed above. The HKMG structure 140 is etched back, and the glue layer 660 is formed over the etched-back HKMG structure 140, and thereafter the conductive capping layer 300 is formed over the glue layer 660. A planarization process is then performed to planarize the upper surfaces of the conductive capping layer 300 and the glue layer 660 until they are substantially co-planar with the upper surfaces of the dielectric structure 190. The gate via 320 is then formed on the upper surface of the conductive capping layer 300.

Regardless of the process flow performed to form the conductive capping layer 300, and regardless of the IC device 200 being a low-threshold-voltage device, a medium-threshold-voltage device, or a high-threshold-voltage device, the implementation of the conductive capping layer 300 herein along a substantial entirety of the upper surface of the HKMG structure 140 in the Y-direction reduces gate resistance, especially for the active region structures located far away from the gate via. Such a gate resistance reduction leads to faster device speed, lower signal loss, etc.

Figure 16:
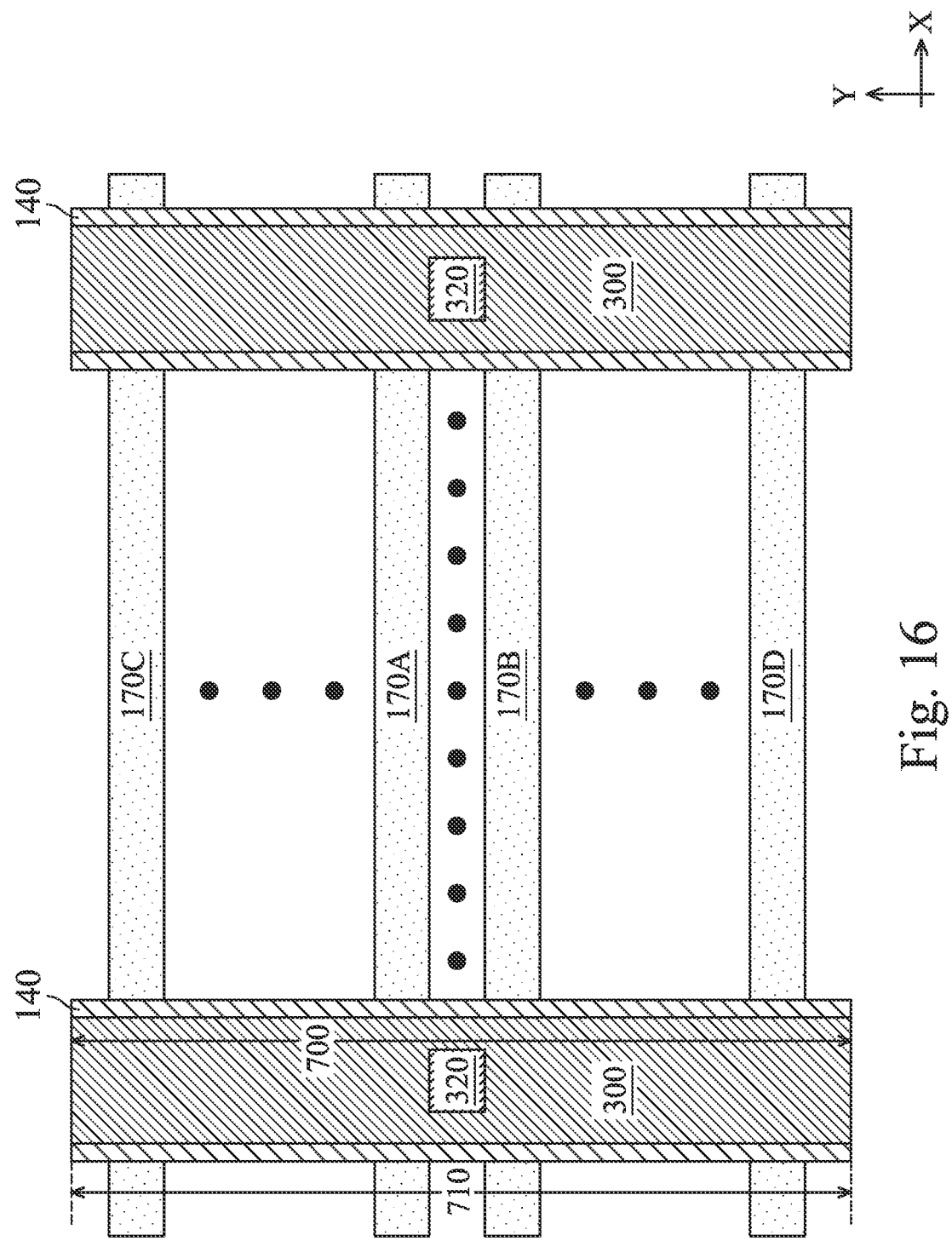
FIG. 16 illustrates a simplified diagrammatic fragmentary top view of a portion of a semiconductor device according to an embodiment of the present disclosure.

FIG. 16 illustrates a simplified diagrammatic fragmentary top view of a portion of the IC device 200 according to an embodiment of the present disclosure. For reasons of simplicity, certain layers and/or additional details about certain layers are not specifically illustrated herein. As shown in FIG. 16, a plurality of active region structures, such as the nano-structures 170A-170D discussed above, extend in the X-direction. Of course, these active region structures may be implemented as stacks of nano-structures (e.g., nano-sheets, nano-tubes, nano-wires, etc.) in embodiments where the IC device 200 is a GAA device. A plurality of HKMG structures 140 each extend in the Y-direction and overlap with the nano-structures 170A-170D in the top view. The conductive capping layer 300 is formed over each of the HKMG structures 140, and the gate via 320 is formed over the conductive capping layer 300. The conductive capping layer 300 extends in the Y-direction, and its dimension 700 in the Y-direction is substantially similar to a dimension 710 of the HKMG structure 140 in the Y-direction. In some embodiments, the dimension 700 is greater than about 90% of the dimension 710. In some embodiments, the dimension 700 is about equal to the dimension 710. As discussed above, the fact that the conductive capping layer 300 is formed over a substantial entirety of an upper surface of the HKMG structure 140 allows the electrical signals traveling through the gate via 320 to reach the active region structures that are located far away (e.g., the nano-structures 170C and 170D) with minimal loss, since the conductive capping layer 300 has a low resistivity and spans through a substantial entirety of the HKMG structure 140 (and therefore all the active region structures located below the HKMG structure 140). As such, the formation of the conductive capping layer herein reduces gate resistance and improves speed.

In a typical IC device that contains many microelectronic components (e.g., gate structures), circuit designs may require that adjacent microelectronic components need to be kept electrically separate (or isolated) from one another. In other words, for some circuits to operate correctly, some of the microelectronic components located close to one another should still be electrically isolated from one another, which may be governed by or checked by a set of design rules. As such, the formation of the conductive capping layer 300 needs to follow such design rules to avoid causing inadvertent or otherwise unintentional electrical shorting between adjacent microelectronic components.

Figure 17:
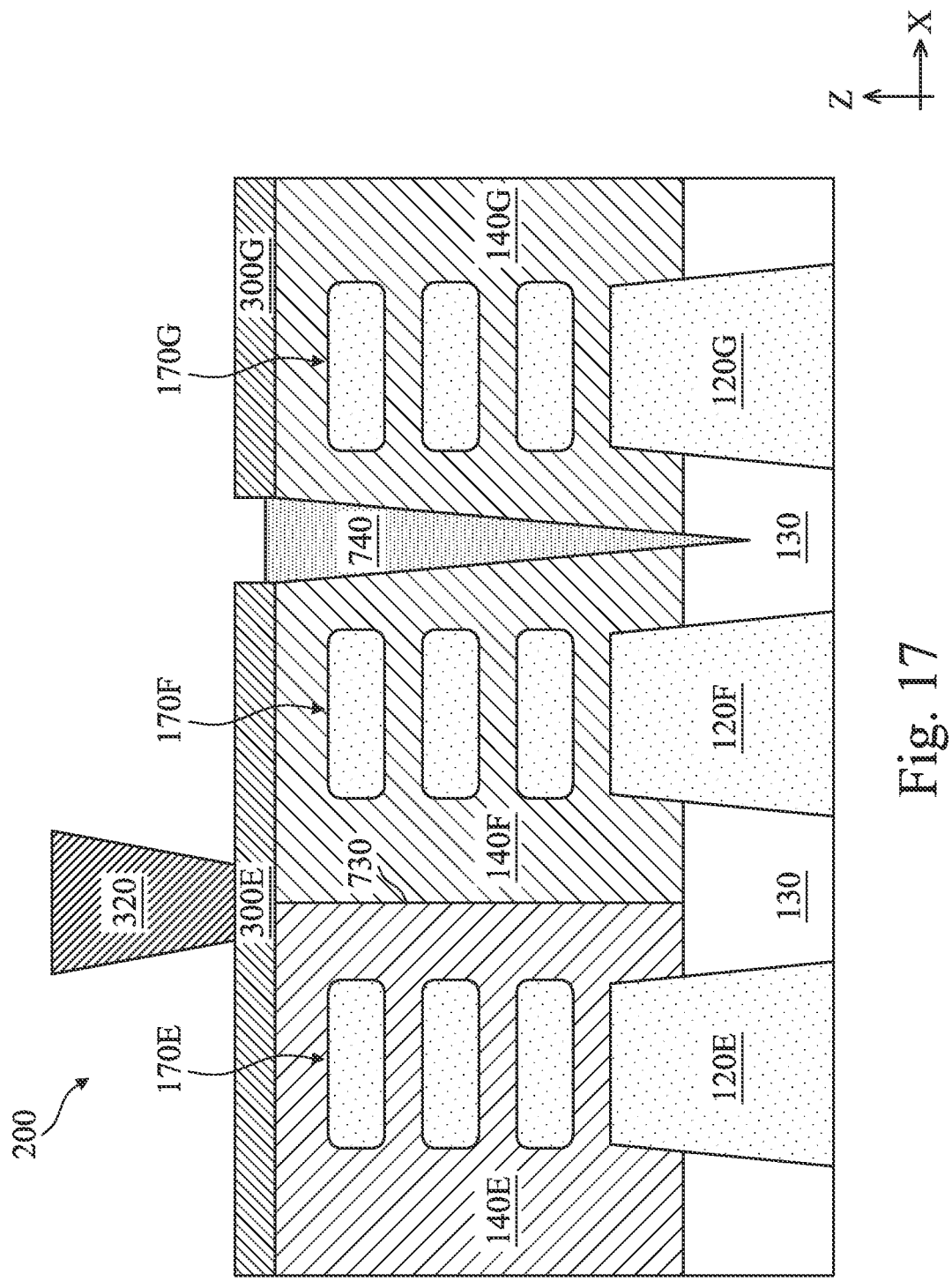
FIG. 17 illustrates a cross-sectional view of a semiconductor device at a stage of fabrication according to embodiments of the present disclosure.

One example of the formation of the conductive capping layer 300 that complies with the design rules according to an embodiment of the present disclosure is illustrated in FIG. 17, which is a Y-cut cross-sectional view (i.e., taken across a Y-Z plane) of a portion of the IC device 200. For reasons of consistency and clarity, similar components in FIG. 17 and FIGS. 1A-1C and FIGS. 2-16 will be labeled the same. The portion of the IC device 200 shown in FIG. 17 includes a plurality of vertical stacks (such as stacks 170E, 170F, and 170G) of nano-structures, that are wrapped around or surrounded by a plurality of HKMG structures 140E, 140F, and 140G, respectively. As discussed above, the nano-structures in the stacks 170E-170G each include a semiconductor material (e.g., silicon) and extend in the X-direction, and they are stacked over one another in the vertical Z-direction. The nano-structures may serve as channels of a transistor. In some embodiments, the nano-structures of the stack 170E and the HKMG 140E are components of an NFET, and the nano-structures of the stack 170F and the HKMG 140F are components of a PFET, where the NFET and the PFET form an interface 730 that extends in the Z-direction. For the purposes of facilitating the ensuing discussions, the HKMG 140E and 140F may be viewed as a single (or merged) gate structure, since they need not be electrically isolated from one another.

However, design rules may specify that the merged gate structure made up of the HKMGs 140E and 140F need to be kept electrically separate from the HKMG 140G, even though the HKMG 140G is disposed adjacent to the HKMG 140F. In other words, the HKMG 140G constitutes a separate and different gate structure than the gate structure made up of the HKMGs 140E and 140F. To ensure the electrical separation between the HKMG 140G and HKMG 140F, a dielectric structure 740 (also referred to as a cut-metal-gate (or CMG) structure) is formed between the HKMG 140F and 140G. In some embodiments, following the formation of the HKMGs 140F-140G, one or more etching processes may be performed to etch a trench or opening that extends vertically (in the Z-direction) into the boundary between the HKMG 140F and 140G. The trench or opening will then be filled by one or more dielectric materials in a subsequent deposition process to form the dielectric structure 740. In some embodiments, the dielectric structure 740 contains silicon nitride, which is a good candidate material for preventing the conduction of electricity. In other embodiments, the dielectric structure 740 may include another electrically insulating material, for example, SiO$_X$, SiCN, SiON, SiOCN, AlO$_X$, HfO$_X$, LaO$_X$, ZrO$_X$, or combinations thereof. In this manner, the dielectric structure 740 effectively serves as an electrical barrier to prevent the undesirable electrical shorting between the HKMG 140F and 140G.

The conductive capping layers 300E and 300G are formed over the upper surfaces of the HKMG structures 140E-140F and 140G, respectively, through a selective growth or selective deposition process, where the materials of the conductive capping layers 300E and 300G are selectively grown on a metal-containing material (e.g., the metal-containing gate electrode of the HKMGs 140E-140G), but not on non-metal materials such as dielectric materials. As such, the upper surface of the dielectric structure 740 is substantially free of having the conductive capping layers 300E or 300G formed thereon. In some embodiments, the selective growth process may be an embodiment of the selective growth process 550 discussed above with reference to FIG. 5. In any case, the selective growth of the conductive capping layers 300E and 300G herein ensures the electrical separation between the HKMG structures 140F and 140G. Had a continuous conductive capping layer been formed across the upper surfaces of the HKMGs 140F and 140G, undesirable electrical shorting between the HKMGs 140F and 140G would have occurred, which would violate design rules and/or lead to IC defects or performance degradations.

Still referring to FIG. 17, the gate via 320 may be formed on the conductive capping layer 300E to provide electrical connectivity to the HKMGs 140E and 140F below. Again, the conductive capping layer 300E is substantially wider than the gate via 320 and has a substantially lower resistivity than either the gate via 320 or the metal gate electrode of the HKMGs 140E-140F. Accordingly, the conductive capping layer 300E helps to reduce parasitic resistance as discussed above. It is noted that although one gate via 320 is illustrated herein for reasons of simplicity, another similar gate via may also be formed on the conductive capping layer 300G to provide electrical connectivity to the HKMG 140G, and the conductive capping layer 300G may also help to reduce the parasitic gate resistance.

Figure 18:
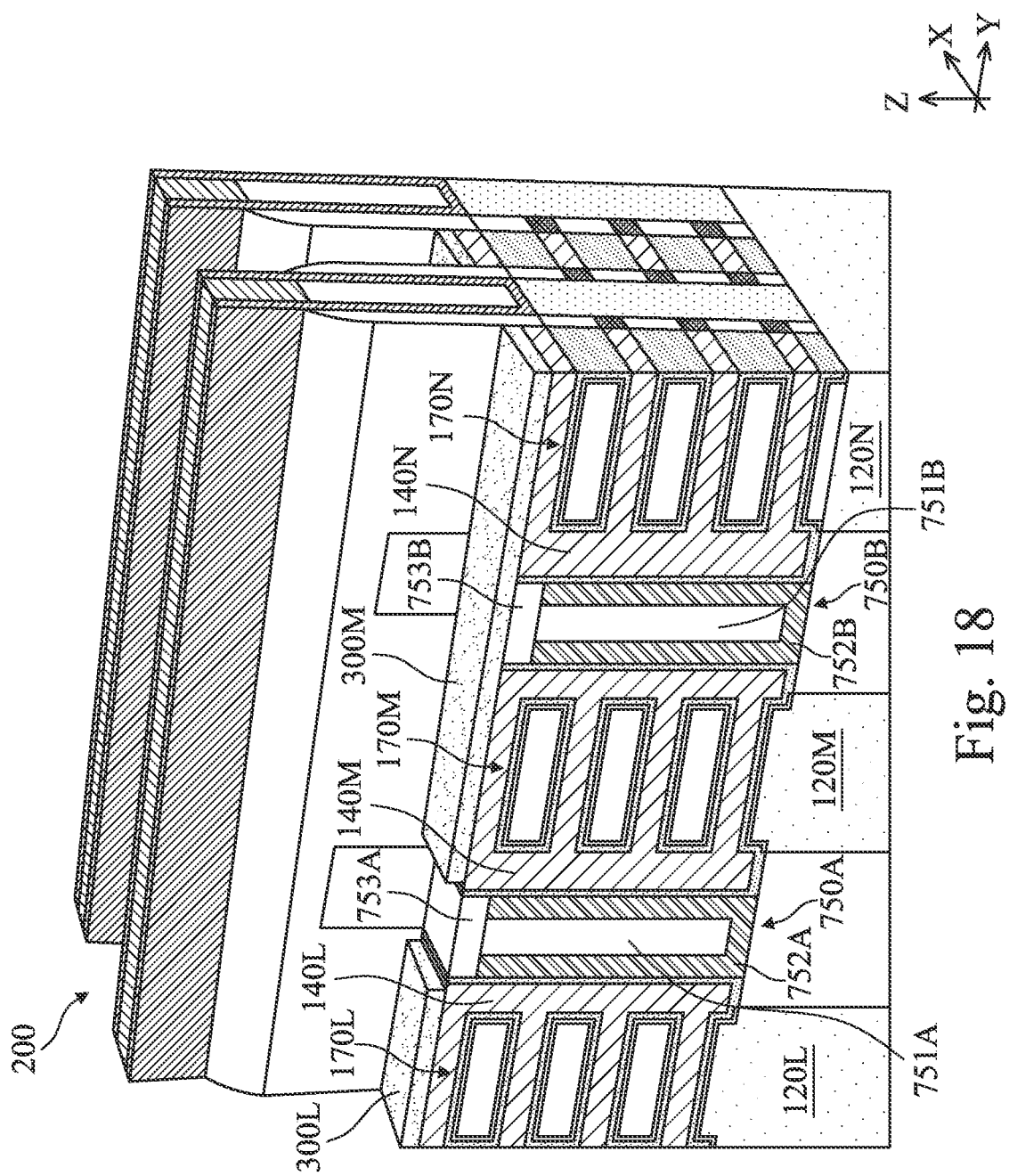
FIG. 18 illustrates a three-dimensional perspective view of a semiconductor device at a stage of fabrication according to embodiments of the present disclosure.

FIG. 17 illustrates how the conductive capping layer may be arranged to ensure the electrical separation of gate structures in an embodiment where the IC device 200 includes a CMG structure. FIG. 18 illustrates how the conductive capping layer may be arranged to ensure the electrical separation of gate structures in another embodiment where the IC device 200 includes dielectric fin structures instead of a CMG structure. In more detail, FIG. 18 illustrates a three-dimensional perspective view of the embodiment of the IC device 200. The IC device 200 includes three example vertical stacks 170L, 170M, 170N, of nano-structures. The nano-structures contain a semiconductor material (e.g., silicon) and each extend in the X-direction. Within each of the stacks 170L-170N, the nano-structures are disposed over one another vertically in the Z-direction. The stacks 170L-170N are separated from one another horizontally in the Y-direction, and they are each surrounded by a respective HKMG 140L, 140M, and 140N.

As shown in FIG. 18, the IC device 200 includes dielectric fin structures 750A and 750B (also referred to as hybrid fin structures). Unlike the fin structures 120L-120N, the dielectric fin structures 750A-750B are not meant to serve as the active regions of transistors. Rather, the dielectric fin structures 750A-750B are configured to prevent the merging of adjacently disposed epitaxially-grown source/drain components of the IC device 200, so as to prevent the unintentional electrical shorting between these epitaxially-grown source/drain components. As such, the dielectric fin structures 750A-750B each include a plurality of electrically insulating materials. For example, the dielectric fin structure 750A includes dielectric layers 751A, 752A, and 753A. The dielectric layer 751A may include a low-k dielectric material or silicon oxide. The dielectric layer 752A may include silicon carbon nitride and may surround the side and bottom surfaces of the dielectric layer 751A. The dielectric layer 753A may include a high-k dielectric material and may be located over the upper surfaces of the dielectric layers 751A and 752A. Similarly, the dielectric fin structure 750B includes dielectric layers 751B, 752B, and 753B, which are arranged the same as, and have material compositions substantially similar to, the dielectric layers 751A, 752A, and 753A.

In the embodiment shown in FIG. 18, the dielectric fin structure 750A is also disposed between the HKMGs 140L-140M, and the dielectric fin structure 750B is also disposed between the HKMGs 140M-140N. Design rules may allow the HKMGs 140M and 140N to be electrically connected to each other, and therefore a conductive capping layer 300M is formed over a substantial entirety of the upper surfaces of both the HKMGs 140M and 140N, as well as over the upper surface of the dielectric fin structure 750B. In other words, the conductive capping layer 300M may electrically connect the HKMG 140M and HKMG 140N together. However, the design rules may also specify that HKMG 140L need to be electrically isolated from the HKMGs 140M-140N. Therefore, a conductive capping layer 300L is formed over a substantial entirety of an upper surface of the HKMG 140L, but it is separated from the conductive capping layer 300M, since no portions of the conductive capping layers 300L or 300M are formed over the dielectric fin structure 750A (specifically, over the dielectric layer 753A).

In some embodiments, a continuous conductive capping layer is initially formed over the upper surfaces of the HKMGs 140L-140N and the dielectric layers 753A-753B (of the dielectric fin structures 750A-750B). Thereafter, one or more etching processes may be performed to etch away portions of such a conductive capping layer over the dielectric layer 753A. In this manner, the continuous conductive capping layer is broken up into the conductive capping layers 300L and 300M. The disconnection between the conductive capping layers 300L and 300M prevents the unintentional electrical shorting between the HKMGs 140L and 140M-140N.

It is understood that a gate via (similar to the gate via 320 discussed above, but not specifically illustrated herein for reasons of simplicity) may be formed over the conductive capping layer 300L, or over the conductive capping layer 300M. Again, the conductive capping layer may have a substantially greater dimension in the Y-direction, as well as a lower resistivity, than such a gate via. As such, the implementation of the conductive capping layers 300L or 300M helps to reduce parasitic gate resistance in the manner discussed above.

In addition to not shorting adjacent gate structures, the implementation of the conductive capping layers herein is also carefully configured to avoid shorting source/drain contacts that are adjacent to one another, which may be achieved using gate spacers. For example, referring now to FIG. 19, a cross-sectional side view of an embodiment of the IC device 200 is taken along the X-direction and the Z-direction (e.g., an X-cut). The nano-structures in FIG. 19 are arranged into vertical stacks of 170P, 170Q, and 170R. HKMGs 140P, 140Q, and 140R are formed over the stacks 170P, 170Q, and 170R, respectively. Conductive capping layers 300P, 300Q, and 300R are formed over the HKMGs 140P, 140Q, and 140R, respectively. As discussed above, the conductive capping layers 300P-300R have lower resistivity than the metal gate electrodes of the HKMGs 140P-140R and the gate vias, and therefore help reduce gate resistance.

The stacks 170P and 170Q are separated in the X-direction by a source/drain component 760A, and the stacks 170Q and 170R are separated in the X-direction by a source/drain component 760B. A source/drain contact 770A is formed over the source/drain component 760A, and a source/drain contact 770B is formed over the source/drain component 760B, to provide electrical connectivity to the source/drain components 760A and 760B, respectively. Design rules may specify that the source/drain contact 770A be kept electrically isolated from the source/drain contact 770B. Therefore, gate spacer structure 160A-160D are implemented to ensure that the conductive capping layers do not inadvertently connect these source/drain contacts 770A-770B together electrically. Specifically, a gate spacer structure 160A is formed between the conductive capping layer 300P and the source/drain contact 770A, a gate spacer structure 160B is formed between the conductive capping layer 300Q and the source/drain contact 770A, a gate spacer structure 160C is formed between the conductive capping layer 300Q and the source/drain contact 770B, and a gate spacer structure 160D is formed between the conductive capping layer 300R and the source/drain contact 770B.

It is understood that in some embodiments, each of the gate spacer structures 160A-160D may include multiple gate spacers (e.g., two or three different gate spacers). In some embodiments, the multiple gate spacers may have different material compositions. For example, one gate spacer may include silicon oxide, while another gate spacer may include silicon nitride, etc. In other embodiments, the different gate spacers may include different types of silicon oxide. Since the gate spacer structures 160A-160D are electrically insulating, inadvertent electrical shorting between the conductive capping layers 300P-300R and their respective nearby source/drain contacts 770A-770B is prevented.

It is understood that the IC device discussed above with the low-resistance conductive capping layer may be implemented in a variety of IC applications, including memory devices such as Static Random-Access Memory (SRAM) devices. In that regard, FIG. 20 illustrates an example circuit schematic for a single-port SRAM cell (e.g., 1-bit SRAM cell) 800. The single-port SRAM cell 800 includes pull-up transistors PU1, PU2; pull-down transistors PD1, PD2; and pass-gate transistors PG1, PG2. As show in the circuit diagram, transistors PU1 and PU2 are p-type transistors, and transistors PG1, PG2, PD1, and PD2 are n-type transistors. According to the various aspects of the present disclosure, the PG1, PG2, PD1, and PD2 transistors are implemented with thinner spacers than the PU1 and PU2 transistors. Since the SRAM cell 800 includes six transistors in the illustrated embodiment, it may also be referred to as a 6T SRAM cell.

The drains of pull-up transistor PU1 and pull-down transistor PD1 are coupled together, and the drains of pull-up transistor PU2 and pull-down transistor PD2 are coupled together. Transistors PU1 and PD1 are cross-coupled with transistors PU2 and PD2 to form a first data latch. The gates of transistors PU2 and PD2 are coupled together and to the drains of transistors PU1 and PD1 to form a first storage node SN1, and the gates of transistors PU1 and PD1 are coupled together and to the drains of transistors PU2 and PD2 to form a complementary first storage node SNB1. Sources of the pull-up transistors PU1 and PU2 are coupled to power voltage Vcc (also referred to as Vdd), and the sources of the pull-down transistors PD1 and PD2 are coupled to a voltage Vss, which may be an electrical ground in some embodiments.

The first storage node SN1 of the first data latch is coupled to bit line BL through pass-gate transistor PG1, and the complementary first storage node SNB1 is coupled to complementary bit line BLB through pass-gate transistor PG2. The first storage node N1 and the complementary first storage node SNB1 are complementary nodes that are often at opposite logic levels (logic high or logic low). Gates of pass-gate transistors PG1 and PG2 are coupled to a word line WL. SRAM devices such as the SRAM cell 800 may be implemented using "planar" transistor devices, with FinFET devices, and/or with GAA devices.

FIG. 21 illustrates an integrated circuit fabrication system 900 according to embodiments of the present disclosure. The fabrication system 900 includes a plurality of entities 902, 904, 906, 908, 910, 912, 914, 916 . . . , N that are connected by a communications network 918. The network 918 may be a single network or may be a variety of different networks, such as an intranet and the Internet, and may include both wire line and wireless communication channels.

In an embodiment, the entity 902 represents a service system for manufacturing collaboration; the entity 904 represents an user, such as product engineer monitoring the interested products; the entity 906 represents an engineer, such as a processing engineer to control process and the relevant recipes, or an equipment engineer to monitor or tune the conditions and setting of the processing tools; the entity 908 represents a metrology tool for IC testing and measurement; the entity 910 represents a semiconductor processing tool, such the processing tools to perform the selective growth process 550 discussed above; the entity 912 represents a virtual metrology module associated with the processing tool 910; the entity 914 represents an advanced processing control module associated with the processing tool 910 and additionally other processing tools; and the entity 916 represents a sampling module associated with the processing tool 910.

Each entity may interact with other entities and may provide integrated circuit fabrication, processing control, and/or calculating capability to and/or receive such capabilities from the other entities. Each entity may also include one or more computer systems for performing calculations and carrying out automations. For example, the advanced processing control module of the entity 914 may include a plurality of computer hardware having software instructions encoded therein. The computer hardware may include hard drives, flash drives, CD-ROMs, RAM memory, display devices (e.g., monitors), input/output device (e.g., mouse and keyboard). The software instructions may be written in any suitable programming language and may be designed to carry out specific tasks.

The integrated circuit fabrication system 900 enables interaction among the entities for the purpose of integrated circuit (IC) manufacturing, as well as the advanced processing control of the IC manufacturing. In an embodiment, the advanced processing control includes adjusting the processing conditions, settings, and/or recipes of one processing tool applicable to the relevant wafers according to the metrology results.

In another embodiment, the metrology results are measured from a subset of processed wafers according to an optimal sampling rate determined based on the process quality and/or product quality. In yet another embodiment, the metrology results are measured from chosen fields and points of the subset of processed wafers according to an optimal sampling field/point determined based on various characteristics of the process quality and/or product quality.

One of the capabilities provided by the IC fabrication system 900 may enable collaboration and information access in such areas as design, engineering, and processing, metrology, and advanced processing control. Another capability provided by the IC fabrication system 900 may integrate systems between facilities, such as between the metrology tool and the processing tool. Such integration enables facilities to coordinate their activities. For example, integrating the metrology tool and the processing tool may enable manufacturing information to be incorporated more efficiently into the fabrication process or the APC module, and may enable wafer data from the online or in site measurement with the metrology tool integrated in the associated processing tool.

FIG. 22 is a flowchart illustrating a method 1000 of fabricating a semiconductor device. The method 1000 includes a step 1010 to form a gate structure over a plurality of stacks of nano-structures. The nano-structures are disposed over one another in a vertically direction and each extend in a first horizontal direction. The gate structure extends in a second horizontal direction different from the first horizontal direction. The gate structure contains metal.

The method 1000 includes a step 1020 to etch back a portion of the gate structure.

The method 1000 includes a step 1030 to grow a conductive capping layer on the gate structure after the gate structure has been etched back. The conductive capping layer has a lower resistivity than the metal of the gate structure. The conductive capping layer spans a substantial entirety of tan upper surface of the gate structure in the second horizontal direction.

The method 1000 includes a step 1040 to form a gate via over the conductive capping layer. The conductive capping layer is substantially wider than the gate via.

In some embodiments, the step 1010 includes forming a high-k gate dielectric and a metal-containing gate electrode. The metal-containing gate electrode includes a plurality of conductive layers and a non-conductive layer. In some embodiments, the step 1030 includes selectively growing the conductive capping layer directly on upper surfaces of the conductive layers, but not directly on an upper surface of the non-conductive layer.

In some embodiments, the step 1010 includes forming a first gate structure and forming a second gate structure. In some embodiments, the method further includes a step to form a dielectric structure that separates the first gate structure and the second gate structure in the second horizontal direction.

In some embodiments, the step 1030 includes selectively growing the conductive capping layer on upper surfaces of the first gate structure and the second gate structure, but not on upper surfaces of the dielectric structure.

It is understood that additional steps may be performed before, during, or after the steps 1010-1040. For example, the method 1000 may include a step of forming the stacks of nano-structures before the gate structure is formed. The method 1000 may also include the formation of other conductive contacts and vias, interconnect lines, packaging, and testing processes. For reasons of simplicity, these additional steps are not discussed in detail herein.

FIG. 23 is a flowchart illustrating a method 1100 of fabricating a semiconductor device. The method 1100 includes a step 1110 to form a gate structure that contains a metal gate electrode over a plurality of stacks of nano-structures. The nano-structures are disposed over one another in a vertically direction and each extend in a first horizontal direction. The gate structure extends in a second horizontal direction different from the first horizontal direction.

The method 1100 includes a step 1120 to etch back a portion of the gate structure.

The method 1100 includes a step 1130 to deposit a glue layer over the gate structure after the gate structure has been etched back.

The method 1100 includes a step 1140 to form a conductive capping layer on the glue layer. The conductive capping layer and the glue layer are formed with different material compositions.

The method 1100 includes a step 1150 to form a gate via over a portion of an upper surface of the conductive capping layer. The gate via and the metal gate electrode each have a greater resistivity than the conductive capping layer.

In some embodiments, the metal gate electrode includes a plurality of conductive layers and a non-conductive layer. In some embodiments the step 1130 comprises depositing the glue layer directly on upper surfaces of the conductive layers and the non-conductive layer, the glue layer defining a recess. In some embodiments, the conductive capping layer is formed in the recess and spans over a substantial entirety of an upper surface of the gate structure in the second horizontal direction.

In some embodiments, the step 1130 comprises depositing a titanium nitride layer as the glue layer. In some embodiments, the step 1140 comprises forming a tungsten-containing layer as the conductive layer.

In some embodiments, the step 1110 includes forming a first gate structure and forming a second gate structure. In some embodiments, the method 1100 further comprises: forming a dielectric fin structure that separates the first gate structure and the second gate structure in the second horizontal direction, wherein the conductive capping layer is formed over upper surfaces of the first gate structure, the second gate structure, and the dielectric fin structure; and removing, through one or more etching processes, a portion of the conductive capping layer covering the dielectric fin structure.

It is understood that additional steps may be performed before, during, or after the steps 1110-1150. For example, the method 1100 may include a step of forming the nano-structures before the gate structure is formed on the fin structures or on the nano-structures. The method 1100 may also include the formation of other conductive contacts and vias, interconnect lines, packaging, and testing processes. For reasons of simplicity, these additional steps are not discussed in detail herein.

In summary, the present disclosure involves forming a conductive capping layer over a gate structure of an IC device. The conductive capping layer has a lower resistivity than the metal-containing gate electrode of the gate structure, as well as having a lower resistivity than a gate via that is then formed on the conductive capping layer. The conductive capping layer also extends along a substantial entirety of the upper surface of the gate structure in at least a Y-direction, which is the same direction in which the gate structure extends. As such, the conductive capping layer is formed over a gate structure that surrounds a plurality of stacks of nano-structures. In a first process flow, the conductive capping layer is formed by etching back a portion of the gate structure, and then selectively growing a low-resistivity material on the various metal-containing layers of the etched-back gate structure. In a second process flow, the conductive capping layer is formed by etching back a portion of the gate structure, depositing a glue layer on the etched-back gate structure, and then depositing a low-resistivity material on the glue layer.

The unique fabrication process flow and the resulting IC device structure of the present disclosure offers advantages over conventional devices. It is understood, however, that no particular advantage is required, other embodiments may offer different advantages, and that not all advantages are necessarily disclosed herein. One advantage is the improved performance of IC devices. For example, as device sizes are scaled down in newer technology generations, gate resistance may become a greater concern than in prior technology generations. This is even more pronounced for active regions that are located far away from the gate via. The increase in gate resistance (especially for these far away devices) may result in a greater time constant, which corresponds to a longer delay and/or slower device speed, a larger signal loss, etc. Here, by implementing the low-resistivity conductive capping layer along a substantial entirety of the upper surface of the gate structure in at least the Y-direction, the gate resistance may be substantially reduced, such that even the devices located far away from the gate via may experience a much smaller gate resistance. Consequently, the IC devices herein may exhibit improved performance, such as faster speed, reduced signal loss, etc. Another advantage is that the conductive capping layers can be selectively deposited, or etched, in a manner such that they do not present electrical shorting risks. Therefore, the conductive capping layers herein are fully compatible with existing fabrication processes/devices, for example, with IC devices that utilize CMG structures or dielectric fin structures.

The advanced lithography process, method, and materials described above can be used in many applications, including multi-channel devices such as Gate-All-Around (GAA) devices, or fin-type field effect transistors (FinFETs). In the case of FinFETs, the fins may be patterned to produce a relatively close spacing between features, for which the above disclosure is well suited. In addition, spacers used in forming fins of FinFETs, also referred to as mandrels, can be processed according to the above disclosure. To the extent that the present disclosure refers to a fin structure or FinFET devices, such discussions may apply equally to the GAA devices, or vice versa.

One aspect of the present disclosure pertains to a semiconductor device. The semiconductor device includes a plurality of stacks of nano-structures. The nano-structures each extend in a first horizontal direction. The stacks each extend in a vertical direction and are separated from one another in a second horizontal direction different from the first horizontal direction. A first gate structure is disposed over a first subset of the stacks of nano-structures. The first gate structure surrounds each of the nano-structures in the first subset. A second gate structure is disposed over a second subset of the stacks of nano-structures. The second gate structure surrounds each of the nano-structures in the second subset. A first conductive capping layer is disposed over a substantial entirety of an upper surface of the first gate structure. A second conductive capping layer is disposed over a substantial entirety of an upper surface of the second gate structure. A dielectric structure is disposed between the first gate structure and the second gate structure in the second horizontal direction. The dielectric structure physically and electrically separates the first gate structure and the second gate structure. An upper surface of the dielectric structure is substantially free of having the first conductive capping layer or the second conductive capping layer disposed thereon.

Another aspect of the present disclosure pertains to a method of fabricating a semiconductor device. A gate structure is formed over a plurality of stacks of nano-structures. The nano-structures are disposed over one another in a vertically direction and each extend in a first horizontal direction. The gate structure extends in a second horizontal direction different from the first horizontal direction. The gate structure contains metal. A portion of the gate structure is etched back. A conductive capping layer is grown on the gate structure after the gate structure has been etched back. The conductive capping layer has a lower resistivity than the metal of the gate structure. The conductive capping layer spans a substantial entirety of tan upper surface of the gate structure in the second horizontal direction. A gate via is formed over the conductive capping layer. The conductive capping layer is substantially wider than the gate via.

Another aspect of the present disclosure pertains to a method of fabricating a semiconductor device. A gate structure is formed that contains a metal gate electrode over a plurality of stacks of nano-structures. The nano-structures are disposed over one another in a vertically direction and each extend in a first horizontal direction. The gate structure extends in a second horizontal direction different from the first horizontal direction. A portion of the gate structure is etched back. A glue layer is deposited over the gate structure after the gate structure has been etched back. A conductive capping is formed layer on the glue layer. The conductive capping layer and the glue layer are formed with different material compositions. A gate via is formed over a portion of an upper surface of the conductive capping layer. The gate via and the metal gate electrode each have a greater resistivity than the conductive capping layer.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, by implementing different thicknesses for the bit line conductor and word line conductor, one can achieve different resistances for the conductors. However, other techniques to vary the resistances of the metal conductors may also be utilized as well.

What is claimed is:
1. A device, comprising:
   a plurality of stacks of nano-structures, wherein the nano-structures each extend in a first horizontal direction, wherein the stacks each extend in a vertical direction and are separated from one another in a second horizontal direction different from the first horizontal direction;
   a first gate structure disposed over a first subset of the stacks of nano-structures, wherein the first gate structure surrounds each of the nano-structures in the first subset;

a second gate structure disposed over a second subset of the stacks of nano-structures, wherein the second gate structure surrounds each of the nano-structures in the second subset;

a first conductive capping layer disposed over a substantial entirety of an upper surface of the first gate structure;

a second conductive capping layer disposed over a substantial entirety of an upper surface of the second gate structure; and a dielectric structure disposed between the first gate structure and the second gate structure in the second horizontal direction, wherein the dielectric structure physically and electrically separates the first gate structure and the second gate structure, and wherein an upper surface of the dielectric structure is substantially free of having the first conductive capping layer or the second conductive capping layer disposed thereon.

2. The device of claim 1, wherein the dielectric structure includes a cut-metal-gate (CMG) structure that contains a single type of dielectric material.

3. The device of claim 1, wherein the dielectric structure includes a dielectric fin structure that contains multiple types of dielectric materials.

4. The device of claim 1, a gate via disposed over the first conductive capping layer or over the second conductive capping layer, wherein a dimension of the gate via measured in the second horizontal direction is substantially less than a dimension of the first conductive capping layer or the second conductive capping layer measured in the second horizontal direction.

5. The device of claim 4, wherein the dimension of the first conductive capping layer or the second conductive capping layer is at least multiple times greater than the dimension of the gate via.

6. The device of claim 4, wherein the first conductive capping layer and the second conductive capping layer each have a lower resistivity than the gate via, the first gate structure, and the second gate structure.

7. The device of claim 1, further comprising a source/drain contact and a gate spacer structure, wherein the gate spacer structure physically and electrically separates the source/drain contact from the first conductive capping layer or from the second conductive capping layer in the first horizontal direction.

8. The device of claim 1, wherein the first conductive capping layer and the second conductive capping layer each contain tungsten.

9. The device of claim 1, wherein:
the first gate structure and the second gate structure each include a respective metal-containing gate electrode; and
the first conductive capping layer or the second conductive capping layer has a lower resistivity than the metal-containing gate electrode.

10. The device of claim 1, wherein in a cross-sectional view defined by the first horizontal direction and the vertical direction, a bottom surface of the first conductive capping layer or the second conductive capping layer includes one or more recesses.

11. The device of claim 10, wherein:
the first gate structure or the second gate structure includes one or more non-conductive layers; and
the one or more recesses are located directly over the one or more non-conductive layers.

12. The device of claim 1, further comprising a glue layer disposed between the first conductive capping layer and the first gate structure or between the second conductive capping layer and the second gate structure, wherein the glue layer defines a recess in a cross-sectional view defined by the first horizontal direction and the vertical direction, and wherein the conductive capping layer is disposed within the recess in the cross-sectional view.

13. A device, comprising:
a first stack of semiconductive nano-structures, wherein the semiconductive nano-structures in the first stack are disposed over one another in a vertical direction in a cross-sectional side view;
a second stack of semiconductive nano-structures, wherein the semiconductive nano-structures in the second stack are disposed over one another in the vertical direction in the cross-sectional side view;
a first gate that circumferentially surrounds the first stack of semiconductive nano-structures in the cross-sectional side view;
a second gate that circumferentially surrounds the second stack of semiconductive nano-structures in the cross-sectional side view;
a first conductive layer disposed over a substantial entirety of an upper surface of the first gate in the cross-sectional side view;
a second conductive layer disposed over a substantial entirety of an upper surface of the second gate in the cross-sectional side view; and
an electrically insulating structure disposed between the first gate and the second gate, and between the first conductive layer and the second conductive layer, in the cross-sectional side view.

14. The device of claim 13, wherein no portion of the first conductive layer or the second conductive layer is disposed on an uppermost surface of the electrically insulating structure in the cross-sectional side view.

15. The device of claim 13, wherein an uppermost surface of the electrically insulating structure is wider than a bottommost surface of the electrically insulating structure in the cross-sectional side view.

16. The device of claim 13, further comprising a gate via disposed over the first conductive layer;
wherein:
the first conductive layer has a lower resistivity than the gate via; or
the first conductive layer is at least multiple times wider than the gate via in the cross-sectional side view.

17. The device of claim 16, wherein the first conductive layer has a lower resistivity than the gate via.

18. The device of claim 16, wherein the first conductive layer is at least multiple times wider than the gate via in the cross-sectional side view.

19. The device of claim 13, wherein:
the first gate has a gate electrode component; and
the first conductive layer or the second conductive layer has a lower resistivity than the gate electrode component.

20. The device of claim 13, wherein the electrically insulating structure has a different depth than the first gate or the second gate in the cross-sectional side view.

21. A device, comprising:
a plurality of stacks of nano-structures, wherein the nano-structures each extend in a first horizontal direction, wherein the stacks each extend in a vertical direction and are separated from one another in a second horizontal direction different from the first horizontal direction;

a first gate structure disposed over a first subset of the stacks of nano-structures, wherein the first gate structure circumferentially surrounds each of the nano-structures in the first subset in a cross-sectional side view defined by the vertical direction and the second horizontal direction;

a second gate structure disposed over a second subset of the stacks of nano-structures, wherein the second gate structure circumferentially surrounds each of the nano-structures in the second subset in the cross-sectional side view;

a first conductive layer disposed over a substantial entirety of an upper surface of the first gate structure in the cross-sectional side view;

a second conductive layer disposed over a substantial entirety of an upper surface of the second gate structure in the cross-sectional side view; and a dielectric structure disposed between the first gate structure and the second gate structure in the second horizontal direction in the cross-sectional side view, wherein the dielectric structure separates the first conductive layer from the second conductive layer.

22. The device of claim 21, wherein the dielectric structure has slanted side surfaces in the cross-sectional side view.

23. The device of claim 21, wherein no portion of the first conductive layer or the second conductive layer is disposed directly on an upper surface of the dielectric structure.

* * * * *